United States Patent
Kito et al.

(10) Patent No.: US 8,559,221 B2
(45) Date of Patent: Oct. 15, 2013

(54) NONVOLATILE SEMICONDUCTOR MEMORY DEVICE AND METHOD FOR DRIVING SAME

(71) Applicants: Masaru Kito, Kanagawa-ken (JP); Hideaki Aochi, Kanagawa-ken (JP)

(72) Inventors: Masaru Kito, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/651,019

(22) Filed: Oct. 12, 2012

(65) Prior Publication Data
US 2013/0033932 A1 Feb. 7, 2013

Related U.S. Application Data

(63) Continuation of application No. 13/017,699, filed on Jan. 31, 2011, now Pat. No. 8,289,766.

(30) Foreign Application Priority Data

Feb. 2, 2010 (JP) .................. 2010-021670

(51) Int. Cl.
*G11C 16/04* (2006.01)
*G11C 11/34* (2006.01)

(52) U.S. Cl.
USPC ............ 365/185.02; 365/185.24; 365/185.17

(58) Field of Classification Search
USPC ........................ 365/185.02, 185.24, 185.17
See application file for complete search history.

(56) References Cited

U.S. PATENT DOCUMENTS

| | | | |
|---|---|---|---|
| 6,717,860 B1 | 4/2004 | Fujiwara | |
| 6,947,330 B2 | 9/2005 | Lee | |
| 7,869,280 B2 | 1/2011 | Kosaki et al. | |
| 8,015,347 B2 * | 9/2011 | Kitsunai et al. | ............... 711/103 |
| 2002/0021587 A1 | 2/2002 | Sakui et al. | |
| 2003/0048661 A1 | 3/2003 | Sakui et al. | |
| 2004/0032788 A1 | 2/2004 | Sakui et al. | |

(Continued)

FOREIGN PATENT DOCUMENTS

| | | |
|---|---|---|
| JP | 2000-149581 A | 5/2000 |
| JP | 2006-228394 A | 8/2006 |
| JP | 2007-320215 | 12/2007 |
| JP | 2008-525933 A | 7/2008 |

OTHER PUBLICATIONS

Office Action issued Feb. 15, 2013 in Japanese Patent Application No. 2010-021670 with English language translation.

*Primary Examiner* — Tuan T. Nguyen
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory unit and a control unit. The memory unit includes a charge storage film and a memory cell transistor. The transistor is provided for each of storage regions configured to store charge in the film. The control unit sets the transistors to an erase threshold by setting erase information in the regions; subsequently sets the transistors to thresholds corresponding to information having n values by programming the information having the n values to at least one of the regions in which the erase information is set; and controls information of at least one storage region before being programmed adjacent to the regions programmed with the information to have a value providing a threshold of the transistor nearer than the erase threshold to the thresholds corresponding to the information having the n values in the state of the transistors provided in the regions being set to the thresholds corresponding to the information having the n values.

19 Claims, 19 Drawing Sheets

(56) References Cited

U.S. PATENT DOCUMENTS

| | | |
|---|---|---|
| 2005/0041476 A1 | 2/2005 | Sakui et al. |
| 2007/0127292 A1 | 6/2007 | Sakui et al. |
| 2007/0133282 A1 | 6/2007 | Sakui et al. |
| 2007/0133283 A1 | 6/2007 | Sakui et al. |
| 2007/0195602 A1 | 8/2007 | Fong et al. |
| 2007/0280000 A1 | 12/2007 | Fujiu et al. |
| 2008/0239812 A1* | 10/2008 | Abiko et al. ............. 365/185.12 |
| 2009/0244969 A1 | 10/2009 | Maejima |
| 2010/0207195 A1 | 8/2010 | Fukuzumi et al. |
| 2011/0216592 A1* | 9/2011 | Nagashima ............... 365/185.11 |
| 2011/0235431 A1* | 9/2011 | Takagiwa ................. 365/185.22 |
| 2012/0020154 A1* | 1/2012 | Namiki et al. ............ 365/185.03 |

* cited by examiner

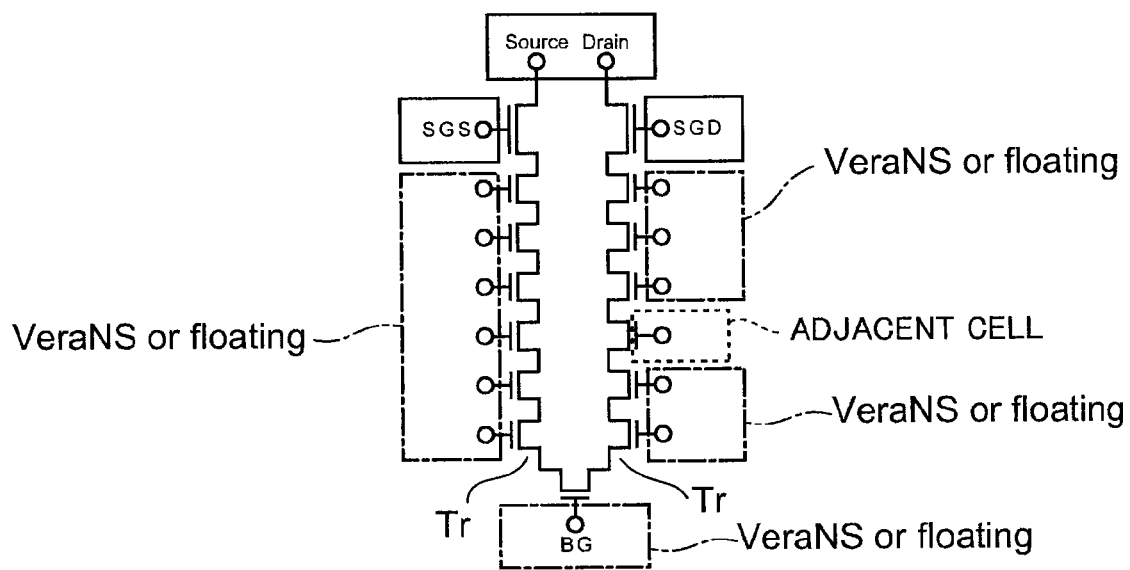
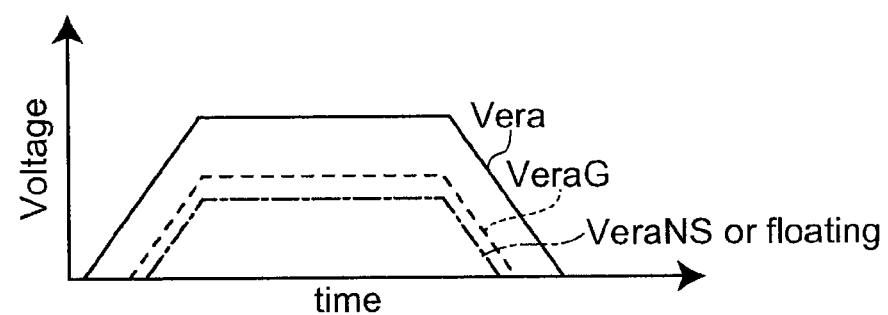
FIG. 1E

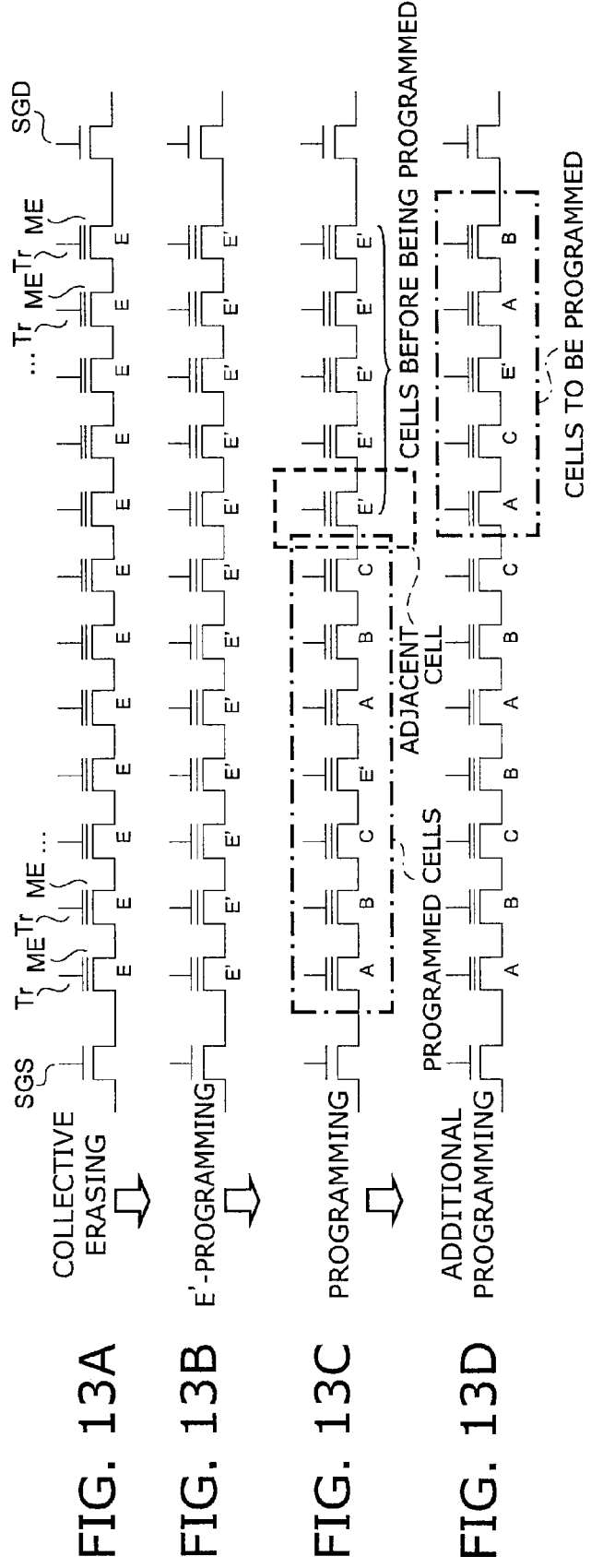

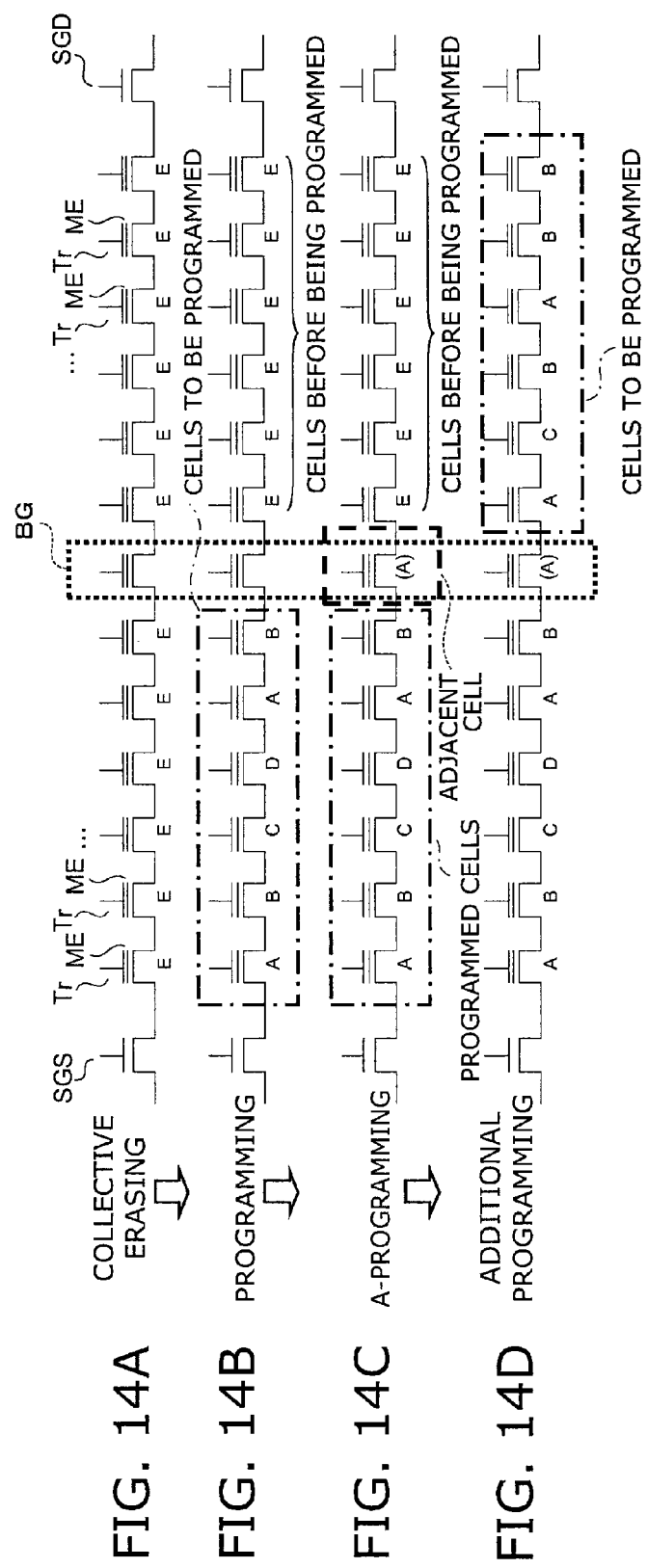

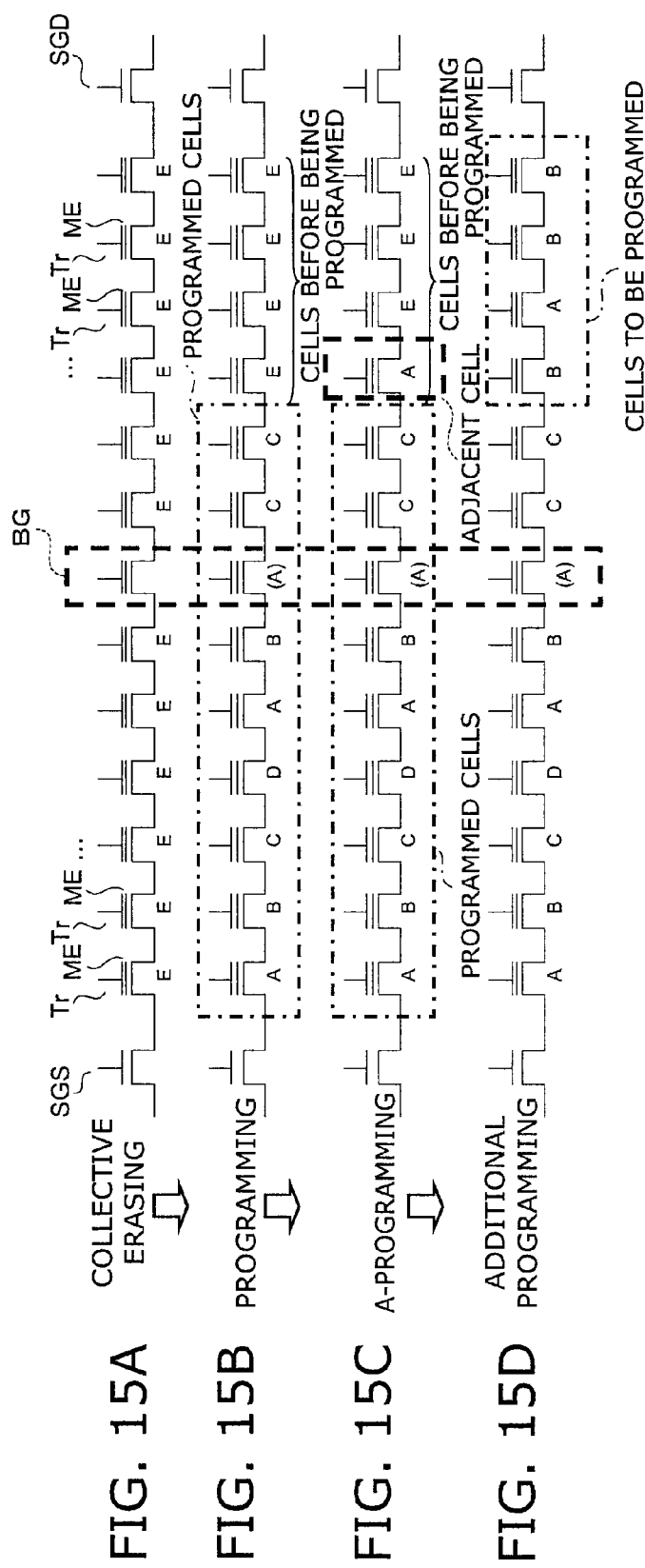

NONVOLATILE SEMICONDUCTOR MEMORY DEVICE AND METHOD FOR DRIVING SAME

CROSS-REFERENCE TO RELATED APPLICATIONS

This application is a continuation application of application Ser. No. 13/017,699 and is based upon and claims the benefit of priority from the prior Japanese Patent Application No. 2010-021670, filed on Feb. 2, 2010; the entire contents of each of which are incorporated herein by reference.

FIELD

Embodiments described herein relate generally to a nonvolatile semiconductor memory device and a method for driving the same.

BACKGROUND

While reducing the dimensions of one element (downscaling) has been necessary to increase the storage capacity in semiconductor memory devices (memory), multi-bit storage technology in which two or more bits of information are stored in one memory cell is also becoming necessary to store more information.

Improvements to photolithography technology and technology to form memory cells in three-dimensional structures are being considered to downscale memory cells.

The inventors of the application have proposed collectively patterned three-dimensionally stacked memory cells that realize a three-dimensional structure using few processes (for example, refer to JP-A 2007-320215 (Kokai)). According to this method, it is possible to suppress cost increases because it is possible to form a stacked memory collectively regardless of the number of stacks.

As such downscaling of memory cells progresses, interference between adjacent cells greatly affects the reliability of the data. Particularly in the case where multi-bit information is stored, the reliability is affected when the thresholds of memory cell transistors corresponding to the multi-bit information programmed to the memory cells fluctuate due to the information of adjacent cells; and the data retention characteristics also may be affected.

BRIEF DESCRIPTION OF THE DRAWINGS

FIGS. 1A to 1E are schematic views illustrating a nonvolatile semiconductor memory device according to an embodiment;

FIGS. 13A to 13D are schematic views illustrating an example of the transition of the information of memory cells of the second embodiment;

FIG. 14A to FIG. 15D are schematic views illustrating an example of the transition of the information of the memory cells of a third embodiment.

DETAILED DESCRIPTION

Figure 1A:
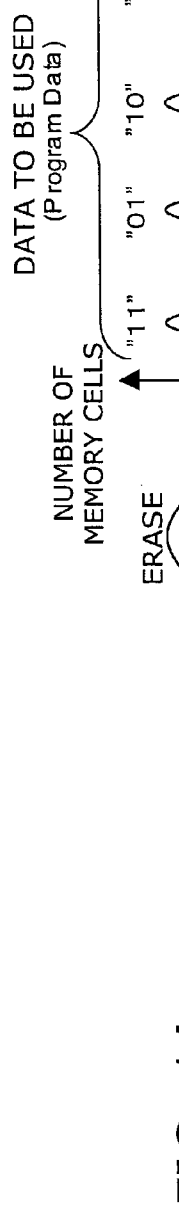

In general, according to one embodiment, a nonvolatile semiconductor memory device includes a memory unit and a control unit. The memory unit includes a charge storage film and a memory cell transistor. The memory cell transistor is provided for each of a plurality of storage regions configured to store charge in the charge storage film. A threshold of the memory cell transistor fluctuates due to information set in the storage region. The control unit is configured to: set the memory cell transistors to an erase threshold by setting erase information in the plurality of storage regions; subsequently set the memory cell transistors provided in the storage regions to thresholds corresponding to information having n (n being an integer not less than 2) values by programming the information having the n values to at least one of the storage regions in which the erase information is set; and control information of at least one storage region before being programmed adjacent to the storage regions programmed with the information to have a value providing a threshold of the memory cell transistor nearer than the erase threshold to the thresholds corresponding to the information having the n values in the state of the memory cell transistors provided in the storage regions being set to the thresholds corresponding to the information having the n values.

According to another embodiment, a method is disclosed for driving a nonvolatile semiconductor memory device. The device includes a charge storage film and a memory cell transistor. The memory cell transistor is provided for each of a plurality of storage regions configured to store charge in the charge storage film. A threshold of the memory cell transistor fluctuates due to information set in the storage regions. The method can set the memory cell transistors to an erase threshold by setting erase information in the plurality of storage regions. Subsequently, the method can set the memory cell transistors provided in the storage regions to thresholds corresponding to information having n (n being an integer not less than 2) values by programming the information having the n values to the storage regions. In addition, the method can control information of at least one storage region before being programmed adjacent to the storage regions programmed with the information to have a value providing a threshold of the memory cell transistor nearer than the erase threshold to the thresholds corresponding to the information having the n values in the state of the memory cell transistors provided in the storage regions being set to the thresholds corresponding to the information having the n values.

Embodiments of the invention will now be described with reference to the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions. In the specification and the drawings of the application, components similar to those described in regard to a drawing thereinabove are marked with like reference numerals, and a detailed description is omitted as appropriate.

FIGS. 1A to 1E are schematic views illustrating a nonvolatile semiconductor memory device according to an embodiment.

Figure 1B:
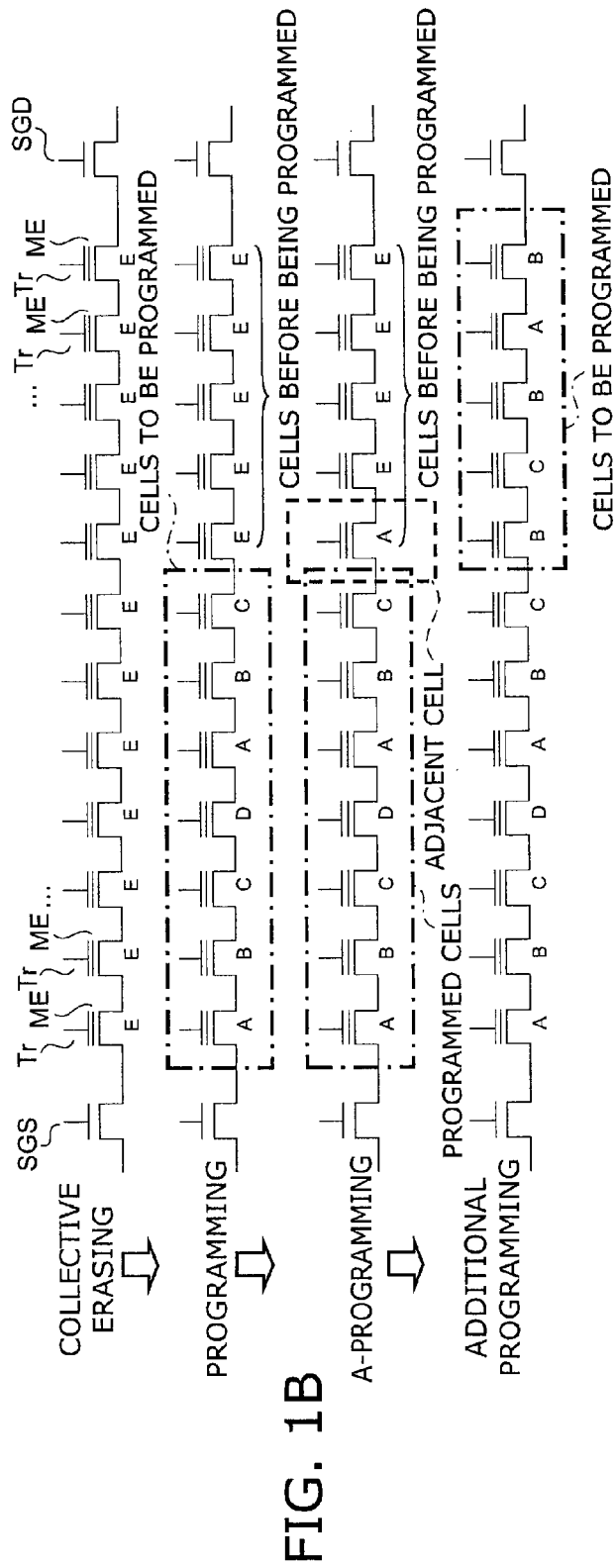

Namely, FIG. 1A illustrates an example of threshold distributions of memory cell transistors; and FIG. 1B illustrates an example of the transition of the information of the memory cells.

Figure 2:
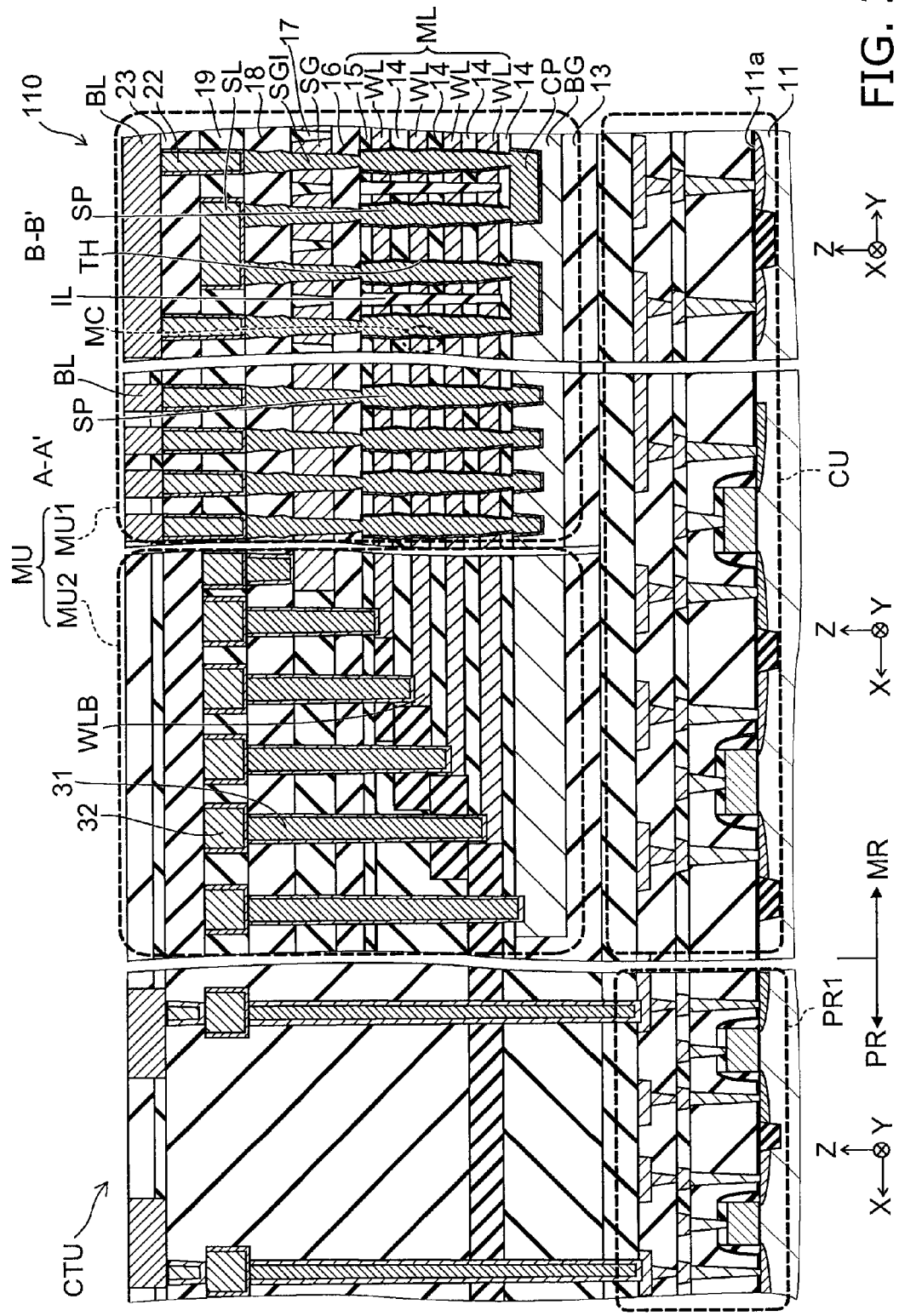
FIG. 2 is a schematic cross-sectional view illustrating the overall configuration of the nonvolatile semiconductor memory device according to the embodiment.

FIG. 2 is a schematic cross-sectional view illustrating the overall configuration of the nonvolatile semiconductor memory device according to the embodiment.

Figure 3:
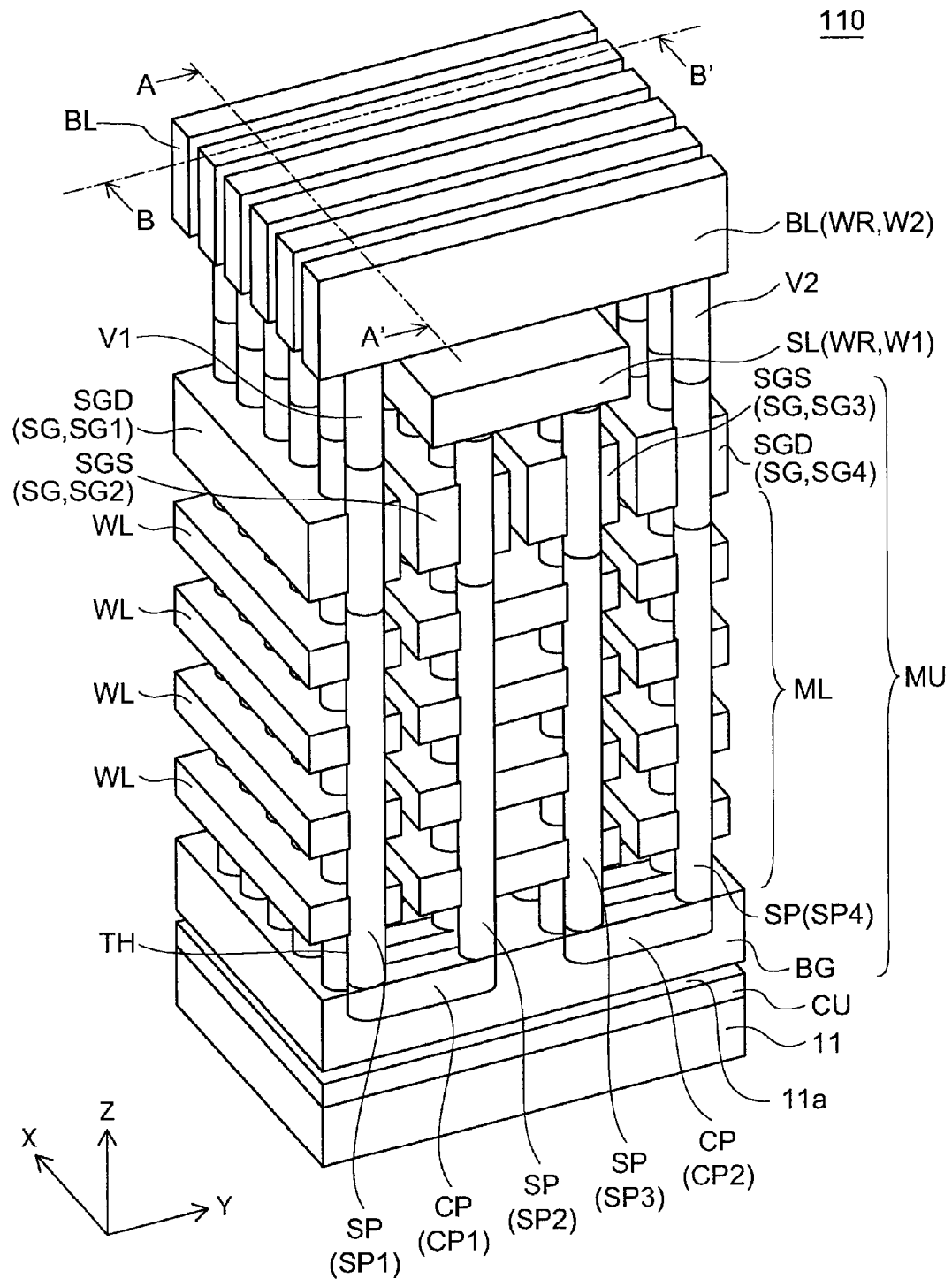
FIG. 3 is a schematic perspective view illustrating the configuration of the nonvolatile semiconductor memory device according to the embodiment.

FIG. 3 is a schematic perspective view illustrating the configuration of the nonvolatile semiconductor memory device according to the embodiment.

For easier viewing of the drawing in FIG. 3, only the conductive portions are illustrated, and the insulating portions are omitted.

Figure 4:
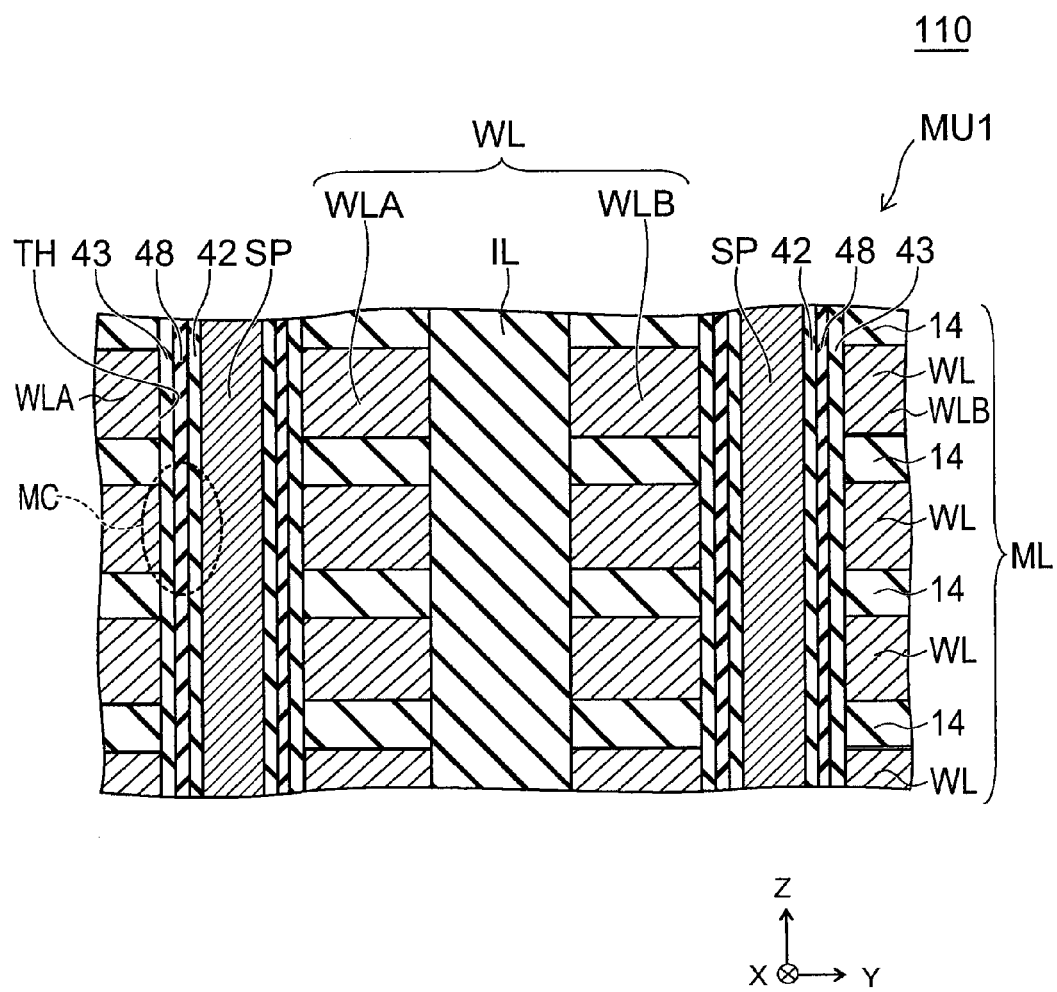
FIG. 4 is a schematic cross-sectional view illustrating the configuration of a portion of the nonvolatile semiconductor memory device according to the embodiment.

FIG. 4 is a schematic cross-sectional view illustrating the configuration of a portion of the nonvolatile semiconductor memory device according to the embodiment.

Figure 5:
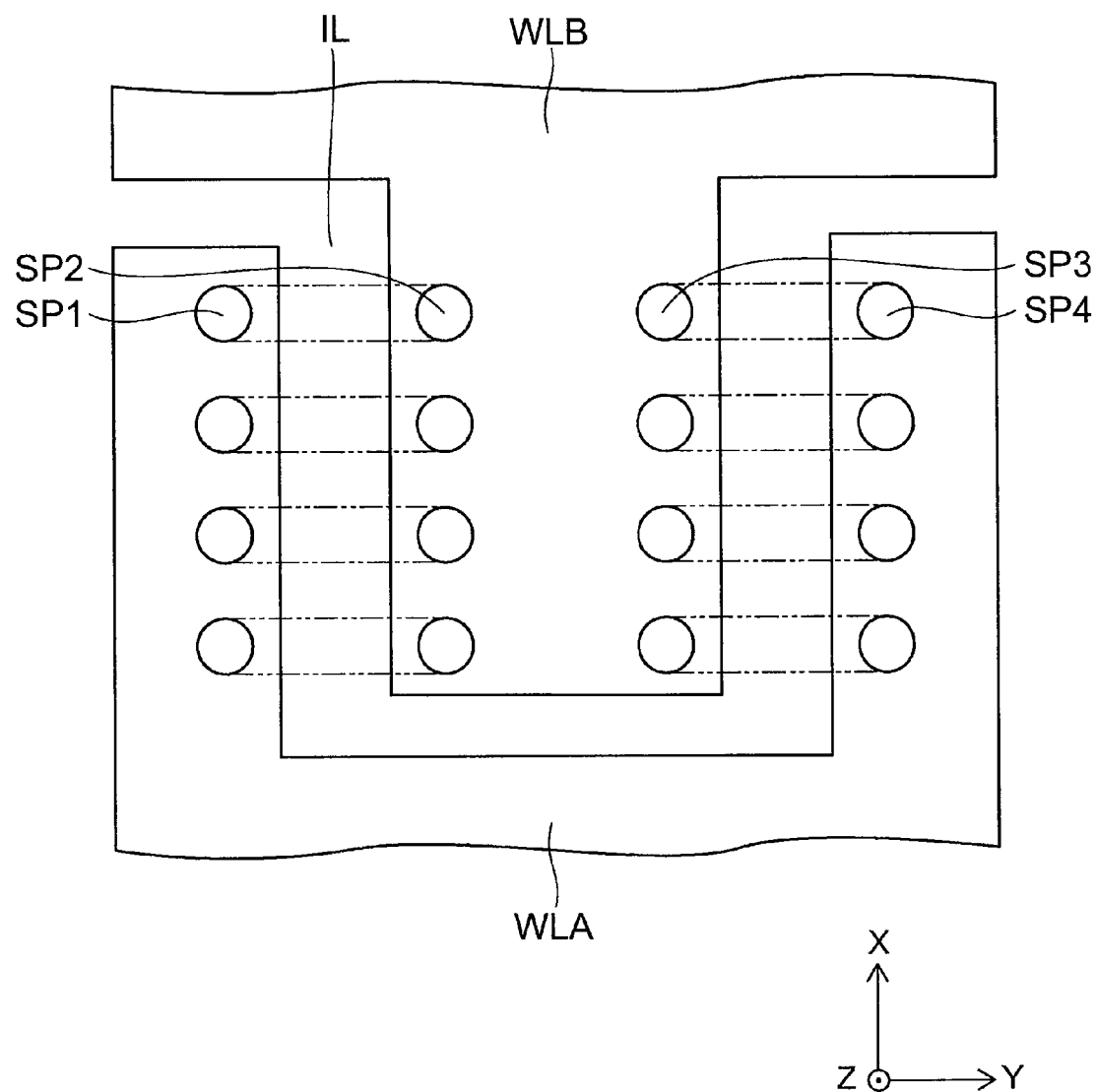
FIG. 5 is a schematic plan view illustrating the configuration of electrode films of the nonvolatile semiconductor memory device according to the embodiment.

FIG. 5 is a schematic plan view illustrating the configuration of electrode films of the nonvolatile semiconductor memory device according to the embodiment.

Configuration of the Nonvolatile Semiconductor Memory Device

The nonvolatile semiconductor memory device 110 according to the embodiment of the invention is a three-dimensionally stacked flash memory.

First, an overview of the configuration of the nonvolatile semiconductor memory device 110 will be described using FIG. 2 to FIG. 5.

As illustrated in FIG. 2, the nonvolatile semiconductor memory device 110 includes a memory unit MU.

The nonvolatile semiconductor memory device 110 may further include a control unit CTU. The memory unit MU and the control unit CTU are provided on a major surface 11a of a semiconductor substrate 11 made of, for example, monocrystalline silicon. However, the control unit CTU may be provided on a substrate separate from the substrate on which the memory unit MU is provided. Hereinbelow, the case is described where the memory unit MU and the control unit CTU are provided on the same substrate (the semiconductor substrate 11).

In the semiconductor substrate 11, for example, a memory array region MR, in which memory cells MC are provided, and a peripheral region PR are set. The peripheral region PR is provided in, for example, the periphery of the memory array region MR. In the peripheral region PR, various peripheral region circuits PR1 are provided on the semiconductor substrate 11.

In the memory array region MR, a circuit unit CU, for example, is provided on the semiconductor substrate 11; and the memory unit MU is provided on the circuit unit CU. The circuit unit CU is provided as necessary and may be omitted. An inter-layer insulating film 13 made of, for example, silicon oxide is provided between the circuit unit CU and the memory unit MU.

At least a portion of the control unit CTU may be provided, for example, in at least one selected from the peripheral region circuit PR1 and the circuit unit CU recited above.

The memory unit MU includes a matrix memory cell unit MU1 including multiple memory cell transistors and an interconnect connection unit MU2 that connects the interconnects of the matrix memory cell unit MU1.

FIG. 3 illustrates the configuration of the matrix memory cell unit MU1.

Namely, a portion of the cross section along A-A' of FIG. 3 and a portion of the cross section along line B-B' of FIG. 3 are illustrated as the matrix memory cell unit MU1 in FIG. 2.

As illustrated in FIG. 2 and FIG. 3, a stacked structural body ML is provided on the major surface 11a of the semiconductor substrate 11 in the matrix memory cell unit MU1. The stacked structural body ML includes multiple electrode films WL and multiple inter-electrode insulating films 14 stacked alternately in a direction perpendicular to the major surface 11a.

In specification of the application, an XYZ orthogonal coordinate system is introduced for convenience of description. In this coordinate system, a direction perpendicular to the major surface 11a of the semiconductor substrate 11 is taken as a Z-axis direction (a first direction). One direction in a plane parallel to the major surface 11a is taken as a Y-axis direction (a second direction). A direction perpendicular to the Z axis and the Y axis is taken as an X-axis direction (a third direction).

The stacking direction of the electrode film WL and the inter-electrode insulating film 14 of the stacked structural body ML is the Z-axis direction. In other words, the electrode film WL and the inter-electrode insulating film 14 are provided parallel to the major surface 11a. The electrode film WL is divided into, for example, erasing block units.

FIG. 4 illustrates the configuration of the matrix memory cell unit MU1 and corresponds to, for example, a portion of the cross section along line B-B' of FIG. 3.

As illustrated in FIG. 3 and FIG. 4, the memory unit MU of the nonvolatile semiconductor memory device 110 includes the stacked structural body ML recited above, a semiconductor pillar SP (a first semiconductor pillar SP1) which is a semiconductor portion piercing the stacked structural body ML in the Z-axis direction, a charge storage film 48, an inner insulating film 42, an outer insulating film 43, and an interconnect WR.

The charge storage film 48 is provided between the semiconductor pillar SP and each of electrode films WL. The inner insulating film 42 is provided between the charge storage film 48 and the semiconductor pillar SP. The outer insulating film 43 is provided between the charge storage film 48 and each of electrode films WL. The interconnect WR is electrically connected to one end of the semiconductor pillar SP.

In other words, the outer insulating film 43, the charge storage film 48, and the inner insulating film 42 are formed in this order on the wall face of the interior of a through-hole TH piercing the stacked structural body ML in the Z-axis direction; and the semiconductor pillar SP is formed by filling a semiconductor into the remaining space.

The memory cells MC are provided at the intersections between the electrode films WL and the semiconductor pillars SP of the stacked structural body ML. In other words, the memory cell transistors including the charge storage film 48 are provided at the portions where the electrode films WL and the semiconductor pillars SP intersect in a three-dimensional matrix configuration; and the memory cell transistors function as the memory cells MC that store data by storing charge in the charge storage film 48. Accordingly, the charge storage film 48 of the memory cells MC at the positions of the electrode films WL function as storage regions; and multiple storage regions are provided along the charge storage film 48.

The inner insulating film 42 functions as a tunneling insulating film of the memory cell transistor of the memory cell MC. On the other hand, the outer insulating film 43 functions as a blocking insulating film of the memory cell transistor of the memory cell MC. The inter-electrode insulating film 14 functions as an inter-layer insulating film that insulates the electrode films WL from each other.

The electrode film WL may include any conductive material. For example, amorphous silicon or polysilicon provided with conductivity by introducing an impurity may be used; and metals, alloys, etc., also may be used. A prescribed electrical signal is applied to the electrode film WL; and the electrode film WL functions as a word line of the nonvolatile semiconductor memory device 110.

The inter-electrode insulating film 14, the inner insulating film 42, and the outer insulating film 43 may include, for example, a silicon oxide film. The inter-electrode insulating film 14, the inner insulating film 42, and the outer insulating film 43 may be single-layer films or may be stacked films.

The charge storage film 48 may include, for example, a silicon nitride film and functions as a portion that stores information by storing or emitting charge by an electric field applied between the semiconductor pillar SP and the electrode film WL. The charge storage film 48 may be a single-layer film or a stacked film.

As described below, the inter-electrode insulating film 14, the inner insulating film 42, the charge storage film 48, and the outer insulating film 43 are not limited to the materials illustrated above; and any material may be used.

Although the case is illustrated in FIG. 2 and FIG. 3 where the stacked structural body ML includes four electrode film WL layers, the number of electrode films WL provided in the stacked structural body ML is arbitrary. Hereinbelow, the case of four electrode films WL will be described.

In this specific example, two of the semiconductor pillars SP are connected by a connection portion CP (a connection portion semiconductor layer).

In other words, the memory unit MU further includes a second semiconductor pillar SP2 (the semiconductor pillar SP) and a first connection portion CP1 (the connection portion CP).

The second semiconductor pillar SP2 is adjacent to the first semiconductor pillar SP1 (the semiconductor pillar SP), for example, in the Y-axis direction to pierce the stacked structural body ML in the Z-axis direction. The first connection portion CP1 electrically connects the first semiconductor pillar SP1 and the second semiconductor pillar SP2 at the same Z-axis direction side (the semiconductor substrate 11 side). The first connection portion CP1 is provided to extend in the Y-axis direction. The first connection portion CP1 may include the same material as the first and second semiconductor pillars SP1 and SP2.

In other words, a back gate BG (a connection portion conductive layer) is provided on the major surface 11a of the semiconductor substrate 11 with the inter-layer insulating film 13 interposed therebetween. A trench (a trench CTR described below) is provided in the portion of the back gate BG opposing the first and second semiconductor pillars SP1 and SP2; the outer insulating film 43, the charge storage film 48, and the inner insulating film 42 are formed in the interior of the trench; and the connection portion CP made of a semiconductor is filled into the remaining space. The formation of the outer insulating film 43, the charge storage film 48, the inner insulating film 42, and the connection portion CP in the trench recited above may be performed collectively and simultaneously with the formation of the outer insulating film 43, the charge storage film 48, the inner insulating film 42, and the semiconductor pillar SP in the through-hole TH. Thus, the back gate BG is provided opposing the connection portion CP.

Thereby, a semiconductor pillar having a U-shaped configuration is formed of the first and second semiconductor pillars SP1 and SP2 and the connection portion CP to form a NAND string having a U-shaped configuration.

Although the connection portion CP includes the function of electrically connecting the first and second semiconductor pillars SP1 and SP2, the connection portion CP also may be utilized as one memory cell. Thereby, more storage bits can be provided. Hereinbelow, the case is described where the connection portion CP electrically connects the first and second semiconductor pillars SP1 and SP2 and is not used as a storage unit. In such a case, although the charge storage film 48 opposing the connection portion CP does not function as a storage unit, the portion of the charge storage film 48 opposing the connection portion CP also is referred to as a "storage layer" to simplify the description.

As illustrated in FIG. 2 and FIG. 3, the end of the first semiconductor pillar SP1 opposite to the first connection portion CP1 is connected to a bit line BL (a second interconnect W2); and the end of the second semiconductor pillar SP2 opposite to the first connection portion CP1 is connected to a source line SL (a first interconnect W1). The semiconductor pillar SP and the bit line BL are connected by a via V1 and a via V2. The interconnect WR includes the first interconnect W1 and the second interconnect W2.

In this specific example, the bit line BL extends in the Y-axis direction; and the source line SL extends in the X-axis direction.

Between the stacked structural body ML and the bit line BL, a drain-side selection gate electrode SGD (a first selection gate electrode SG1, i.e., the selection gate electrode SG) is provided opposing the first semiconductor pillar SP1; and a source-side selection gate electrode SGS (a second selection gate electrode SG2, i.e., the selection gate electrode SG) is provided opposing the second semiconductor pillar SP2. Thereby, the desired data can be the programmed to or read from any memory cell MC of any semiconductor pillar SP.

The selection gate electrode SG may include any conductive material. For example, polysilicon or amorphous silicon may be used. In this specific example, the selection gate electrode SG is divided in the Y-axis direction and has a band configuration extending along the X-axis direction.

As illustrated in FIG. 2, an inter-layer insulating film 15 is provided in the uppermost portion (the side most distal to the semiconductor substrate 11) of the stacked structural body ML. An inter-layer insulating film 16 is provided on the stacked structural body ML; the selection gate electrode SG is provided thereon; and an inter-layer insulating film 17 is provided between the selection gate electrodes SG. A through-hole is provided in the selection gate electrode SG; a selection gate insulating film SGI of the selection gate transistor is provided on an inner side face thereof; and a semiconductor is filled therein. This semiconductor continues from the semiconductor pillar SP. In other words, the memory unit MU further includes the selection gate electrode SG stacked on the stacked structural body ML in the Z-axis direction and pierced by the semiconductor pillar SP at the interconnect WR (at least one selected from the source line SL and the bit line BL) side.

An inter-layer insulating film 18 is provided on the inter-layer insulating film 17; the source line SL and a via 22 (the vias V1 and V2) are provided thereon; and an inter-layer insulating film 19 is provided around the source line SL. An inter-layer insulating film 23 is provided on the source line SL; and the bit line BL is provided thereon. The bit line BL has a band configuration along the Y-axis direction.

The inter-layer insulating films 15, 16, 17, 18, 19, and 23 and the selection gate insulating film SGI may include, for example, silicon oxide.

Herein, the semiconductor pillar is multiply provided in the nonvolatile semiconductor memory device 110. "Semiconductor pillar SP" is used to refer to all of the semiconductor pillars or any semiconductor pillar; and "nth semiconductor pillar SPn" (n being any integer not less than 1) is used to refer to a designated semiconductor pillar when describing a relationship between semiconductor pillars, etc.

For the electrode films WL as illustrated in FIG. 5, the electrode films corresponding to the semiconductor pillars SP(4m+1) and SP(4m+4) have a common connection to form an electrode film WLA, where m is an integer not less than 0 and n is (4m+1) and (4m+4); and the electrode films corresponding to the semiconductor pillars SP(4m+2) and SP(4m+3) have a common connection to form an electrode film WLB, where n is (4m+2) and (4m+3). In other words, the electrode films WL have a configuration in which the electrode film WLA and the electrode film WLB are combined with each other in a comb teeth configuration opposing in the X-axis direction.

As illustrated in FIG. 4 and FIG. 5, the electrode film WL is divided by an insulating layer IL; and the electrode film WL is divided into a first region (the electrode film WLA) and a second region (the electrode film WLB).

As in the interconnect connection unit MU2 illustrated in FIG. 2, the electrode film WLB is connected at one X-axis direction end to a word interconnect 32 by a via plug 31 and is electrically connected to, for example, a drive circuit provided in the semiconductor substrate 11. Similarly, the electrode film WLA is connected at the other X-axis direction end to the word interconnect by the via plug and is electrically connected to the drive circuit. In other words, the length in the X-axis direction of each of the electrode films WL (the electrode film WLA and the electrode film WLB) stacked in the Z-axis direction changes in a stairstep configuration; and the electrode films WL are electrically connected to the drive circuit by the electrode film WLA at the one X-axis direction end and by the electrode film WLB at the other X-axis direction end.

As illustrated in FIG. 3, the memory unit MU may further include a third semiconductor pillar SP3 (the semiconductor pillar SP), a fourth semiconductor pillar SP4 (the semiconductor pillar SP), and a second connection portion CP2 (the connection portion CP).

The third semiconductor pillar SP3 is adjacent to the second semiconductor pillar SP2 in the Y-axis direction on the side of the second semiconductor pillar SP2 opposite to the first semiconductor pillar SP1 and pierces the stacked structural body ML in the Z-axis direction. The fourth semiconductor pillar SP4 is adjacent to the third semiconductor pillar SP3 in the Y-axis direction on the side of the third semiconductor pillar SP3 opposite to the second semiconductor pillar SP2 and pierces the stacked structural body ML in the Z-axis direction.

The second connection portion CP2 electrically connects the third semiconductor pillar SP3 and the fourth semiconductor pillar SP4 on the same side (the same side as the first connection portion CP1) in the Z-axis direction. The second connection portion CP2 is provided to extend in the Y-axis direction to oppose the back gate BG.

The charge storage film 48 is provided between the third semiconductor pillar SP3 and each of the electrode films WL, between the fourth semiconductor pillar SP4 and each of the electrode films WL, and between the back gate BG and the second connection portion CP2. The inner insulating film 42 is provided between the third semiconductor pillar SP3 and the charge storage film 48, between the fourth semiconductor pillar SP4 and the charge storage film 48, and between the charge storage film 48 and the second connection portion CP2. The outer insulating film 43 is provided between the charge storage film 48 and each of the electrode films WL and between the charge storage film 48 and the back gate BG.

The source line SL is connected to a third end portion of the third semiconductor pillar SP3 on the side opposite to the second connection portion CP2. The bit line BL is connected to a fourth end portion of the fourth semiconductor pillar SP4 on the side opposite to the second connection portion CP2.

The source-side selection gate electrode SGS (the third selection gate electrode SG3, i.e., the selection gate electrode SG) is provided to oppose the third semiconductor pillar SP3. The drain-side selection gate electrode SGD (the fourth selection gate electrode SG4, i.e., the selection gate electrode SG) is provided to oppose the fourth semiconductor pillar SP4.

The embodiments will now be described. One feature of the nonvolatile semiconductor memory device 110 according to the embodiments regards the threshold of the memory cell transistor being set in the erasing operation and the programming operation of the memory cells by the control unit CTU. Hereinbelow, the embodiments are described with a focus on the operations of the threshold setting by the control unit CTU. Although the invention may be applied to technology that records information having n (n being an integer not less than 2) values in one memory cell, an example is used hereinbelow in which information having n=4, i.e., four-valued information, is recorded to simplify the description. The four-valued information is the two-bit data "11," "10," "01," and "00."

The recording of the four-valued information in the memory cells is performed by injecting charge having amounts according to the four-valued information into the storage region of each of the memory cells. Because the threshold of the memory cell transistor fluctuates according to the amount of the charge of the storage region, it is read whether one of the four values is stored by applying to the memory cell transistor a prescribed voltage that can identify the four values and from the operating state at that time.

In the case where the four-valued information is recorded in the memory cells, the thresholds of the memory cell transistors can have four distributions according to the four-valued information. In the case where the information of the memory cells is erased, the memory cell transistors are set to the erase threshold. The erase threshold also can have a distribution in a certain range. In the description hereinbelow, these thresholds are illustrated using symbols A, B, C, D, and E. In the description hereinbelow, the threshold of the memory cell transistor also may be referred to as simply "the threshold of the memory cell."

First Embodiment

The configuration of a nonvolatile semiconductor memory device according to a first embodiment may be applied not only to the configuration of the nonvolatile semiconductor memory device according to the embodiment described using FIG. 2 to FIG. 5 but also to the configuration of a nonvolatile semiconductor memory device which has no connection portion and no back gate BG and includes NAND strings having I-shaped configurations in which each of the semiconductor pillars is independent and the configuration of a planar nonvolatile semiconductor memory device in which a MONOS structure is provided in a planar configuration.

As illustrated in FIG. 1A, the control unit CTU (referring to FIG. 2) is configured to set the thresholds of memory cell transistors Tr according to the operations of the erase threshold E and the thresholds A to D corresponding to the four-valued information. In other words, the control unit CTU uses n+1 thresholds when performing the recording of the information having the n values.

Of the distributions of these thresholds as illustrated in FIG. 1A, all of the values of the distribution of the erase threshold E from the upper limit to the lower limit are on the negative polarity side. On the other hand, all of the values of the distributions of the thresholds A to D corresponding to each of the four-valued information are on the positive polarity side.

It is favorable for the widths of the distributions of the thresholds A to D to be set to be narrower than the width of the distribution of the threshold E. In other words, it is necessary for the distributions of the thresholds A to D for representing the four-valued information to be reliably contained in one of the distributions of the thresholds A to D to suppress erroneous detection during the read out. To this end, the programming of the information to the memory cells includes performing a verify operation of the programming that repeatedly programs until the memory cell transistors reach a threshold voltage not less than a program verify voltage. As long as it is possible to determine the four-valued information, the verify operation of the programming may not be performed.

On the other hand, the erasing operation of the memory cells is performed collectively to erase the information of multiple memory cells. At this time, while the thresholds of the memory cell transistors are set to be negative, a wide distribution can be used because it is unnecessary to discriminate within the erase information. Therefore, in the erasing operation which takes more time compared to the programming of the information, the verify operations of the erasing in which the erasing is performed repeatedly until the memory cell transistors reach a threshold voltage not more than an erase verification voltage can be fewer than the verify operations of the programming. As long as it is possible to determine the erase information, the verify operation of the erasing may not be performed.

FIG. 1B illustrates the transition of the information according to the operations of the control unit CTU. This drawing illustrates a string in which multiple memory cells are connected in series. This drawing illustrates an equivalent circuit to describe this embodiment; and the string is simplified for description by being illustrated as a circuit extending in one direction. This does not represent the actual configuration. Restated, all three-dimensional memory, so-called planar NAND in which a MONOS structure is provided on a plane, and any configuration which can be illustrated similarly by an equivalent circuit can be applied to this embodiment.

A storage region ME and the memory cell transistor Tr are provided in each of the memory cells. A selection transistor controlled by the source-side selection gate electrode SGS is connected to one end of the successive memory cell transistors Tr; and a selection transistor controlled by the drain-side selection gate electrode SGD is connected to the other end.

The control unit CTU is configured to perform "collective erasing," "programming," "A-programming," and then "additional programming" in this order from above as illustrated in FIG. 1B.

First, the control unit CTU performs the collective erasing of the multiple memory cells of the string. By the erasing operation, the thresholds of the multiple memory cell transistors Tr are set to the threshold E. At this time, this is a state in which the width of the distribution of the threshold E is relatively wide.

Then, the control unit CTU performs the programming of the information to the cells to be programmed of the string. The programming is performed, for example, in order from the memory cell on the source side. In the memory cells to be programmed, a high voltage is applied to the tunneling oxide film; and an amount of electrons corresponding to the four-valued information is injected into the storage region. On the other hand, in the memory cells not to be programmed, a high voltage is not applied to the tunneling oxide film; and electrons are not injected into the storage region. The programming is not always limited to the case of being performed from the memory cell on the source side and may be performed from the memory cell on the drain side or to randomly-accessed memory cells.

By the programming of the information, the thresholds of the memory cell transistors Tr of the cells to be programmed are set to one selected from the thresholds A to D corresponding to the four-valued information. In other words, in the memory cells in which the information of "11" from the four values is programmed, the thresholds of the memory cell transistors Tr are set to the threshold A. In the memory cells in which the information of "01" from the four values is programmed, the thresholds of the memory cell transistors Tr are set to the threshold B which is higher than the distribution of the threshold A. In the memory cells in which the information of "10" from the four values is programmed, the thresholds of the memory cell transistors Tr are set to the threshold C which is higher than the distribution of the threshold B. In the memory cells in which the information of "00" from the four values is programmed, the thresholds of the memory cell transistors Tr are set to the threshold D which is higher than the distribution of the threshold C.

As described above, because all of the values of the distributions of the thresholds A to D corresponding to the four-valued information are on the positive polarity side, all of the values of the thresholds of the memory cell transistors Tr of the cells to be programmed are set to be on the positive polarity side.

In the programming, it is favorable for the verify operation of the programming to be performed such that the thresholds of the memory cell transistors Tr of the cells to be programmed are contained in the distributions of the thresholds A to D corresponding to the four-valued information. As long as it is possible to determine the four-valued information, the verify operation of the programming may not be performed. Thereby, the widths of the distributions of the thresholds A to D are narrower than the distribution of the erase threshold E; and the four-valued information can be discriminated reliably. Then, the control unit CTU performs the A-programming.

The A-programming is processing to program information to at least one cell before being programmed adjacent to the programmed cells such that the threshold of the memory cell transistor becomes the threshold A. Here, the at least one cell before being programmed adjacent to the programmed cells is referred to as the "adjacent cell."

Although the case of one adjacent cell is illustrated in FIG. 1B, the adjacent cell may be two or more or may be all of the cells before being programmed. The A-programming may be executed as a programming separate from the programming performed previously or may continue from the programming to the cells to be programmed as an extension of the programming performed previously to program information to the adjacent cell.

The A-programming is an operation that programs the information to the adjacent cell to provide a value nearer than the distribution of the erase threshold E to the thresholds A to D corresponding to the four-valued information. Of the thresholds A to D corresponding to the four-valued information in the example illustrated in FIG. 1B, the threshold A having the lowest voltage is utilized as this value.

Figure 1C:
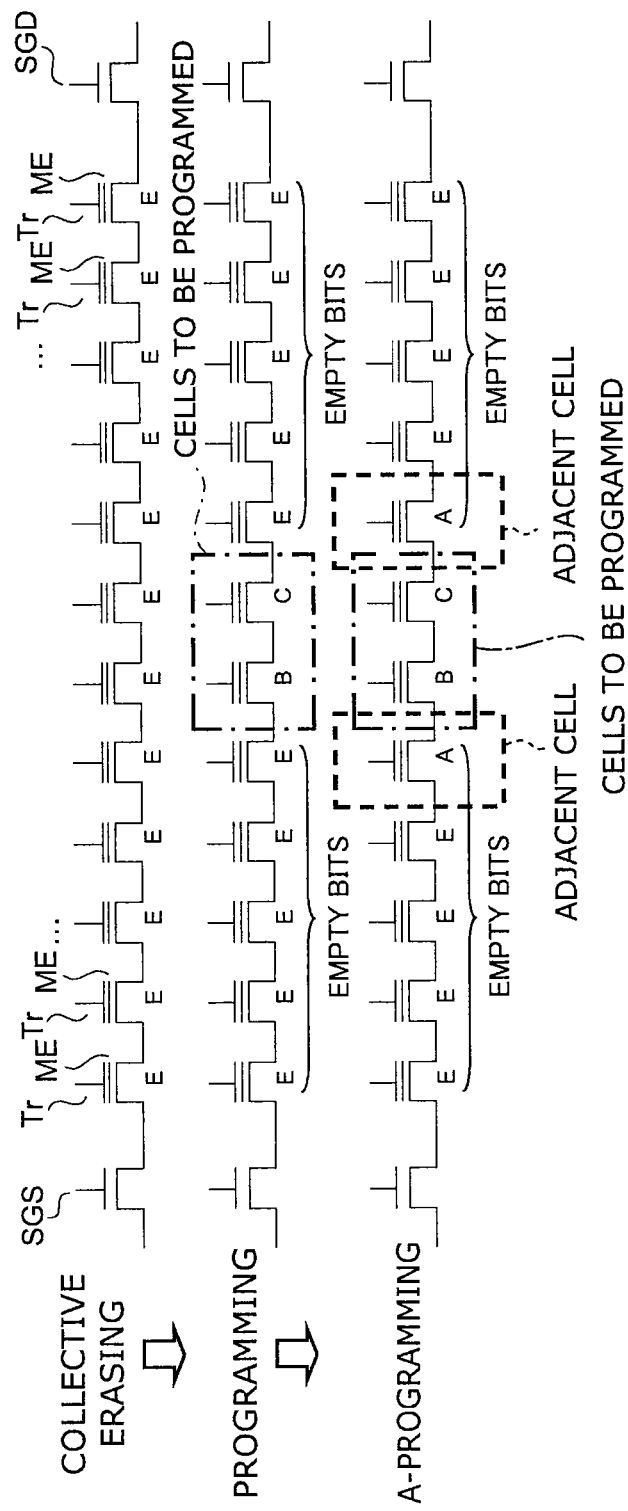

In the case where the programming is performed to randomly-accessed memory cells as illustrated in FIG. 1C, the A-programming may be performed to the adjacent cells on either side of the programmed cells (the cells to be programmed).

By the A-programming, the difference of the set thresholds, i.e., the difference of the charge, between the memory cell at the end of the cells to be programmed and the cell before being programmed adjacent to the memory cell is less than in the state directly after the programming.

Directly after the programming in the example illustrated in FIG. 1B, the set threshold level of the memory cell at the end of the cells to be programmed is C; and the threshold of the cell before being programmed adjacent thereto is E, i.e., as-is in the erased state. Thereby, the difference of the thresholds between the memory cell at the end of the cells to be programmed and the adjacent cell is C-E.

By performing the A-programming from this state, the threshold distribution of the adjacent cell becomes from the distribution of the threshold E to the distribution of the threshold A. Thereby, the difference of the thresholds between the memory cell at the end of the cells to be programmed and the adjacent cell becomes C-A. Accordingly, after the A-programming, the difference of the thresholds between the memory cell at the end of the cells to be programmed and the adjacent cell is reduced from that prior to the A-programming by an amount of A-E. Thus, by the difference of the thresholds being reduced, the memory cell at the end of the cells to be programmed is less susceptible to effects from the adjacent cell, which leads to better data retention characteristics.

Then, the control unit CTU performs the additional programming. The additional programming is processing to program the desired four-valued information to cells to be programmed in a latter stage and includes the adjacent cell to which the A-programming was performed. The additional programming can be executed by a method similar to the programming. Here, because the threshold of the memory cell transistor Tr of the adjacent cell to which the A-programming was performed is the distribution of the threshold A, this cell is reprogrammed to one selected from the thresholds A to D of the four values.

Because the threshold A which has the lowest voltage of the four-valued information is utilized in the A-programming, it is sufficient for the processing to increase the charge injected into the storage region when reprogramming to the other information (B to D). That is, the additional programming of the desired information can be performed as-is without performing the erasing operation. In the case where additional programming of the information corresponding to the threshold A is performed to the adjacent cell, it is unnecessary to program anything.

In the case where the thresholds B to D are programmed as substitute for the A-programming, it is necessary to perform an operation to selectively change the cells for which the additional programming is to be performed to the threshold E.

Figure 1D:
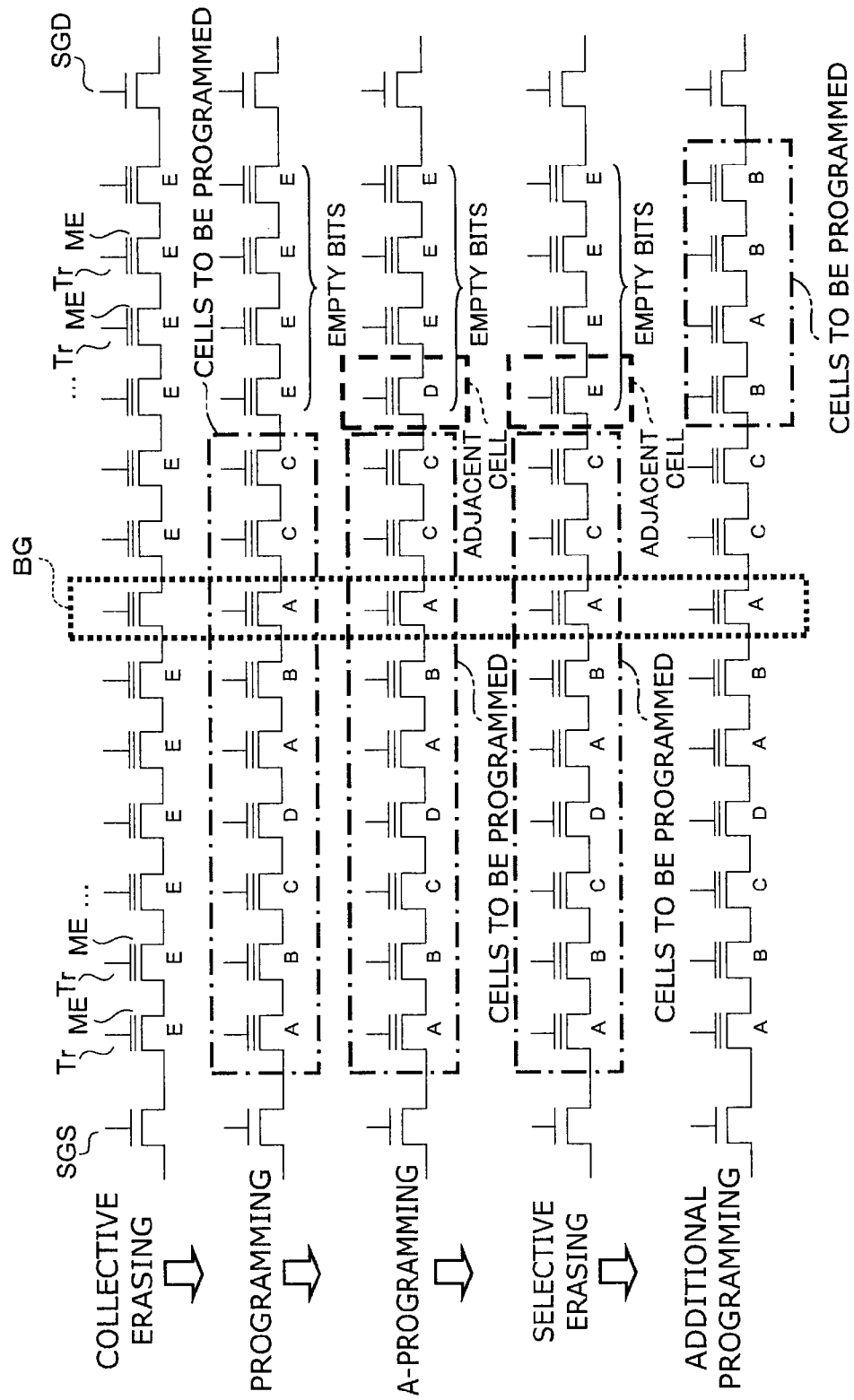

FIG. 1D illustrates the transition of the information in the case where the threshold D is used as substitute for the A-programming.

FIG. 1E illustrates the operation of changing only the cell to be programmed to the threshold E.

In the example illustrated in FIG. 1D, the threshold D, for example, is programmed to the adjacent cell of the cells to be programmed as substitute for the A-programming. In such a case, the adjacent cell is changed to the threshold E prior to the additional programming. Subsequently, the additional programming to the adjacent cell is performed.

Specifically, as illustrated in FIG. 1E, a reference potential (e.g., a grounding potential GND) is applied to only the adjacent cell to be changed to the threshold E; and the other cells are floating or an intermediate potential VeraNS is applied. The intermediate potential VeraNS is a potential between the reference potential (e.g., the grounding potential GND) and a potential Vera for erasing. Thereby, only the memory cell transistor Tr of the cell to be changed (the adjacent cell) fixed at the reference potential is changed to the threshold E.

Data Retention Characteristics

Figure 6:
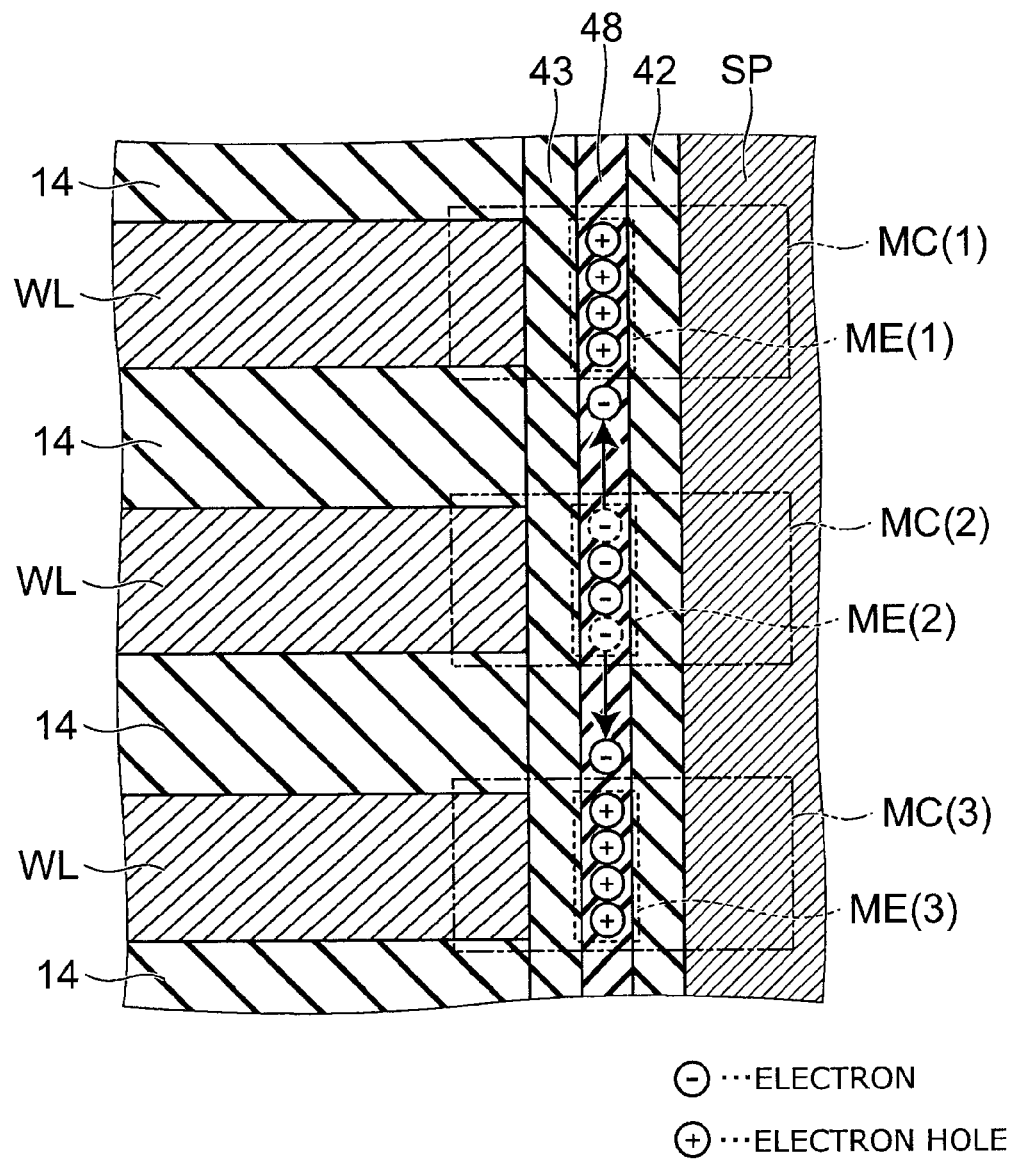
FIG. 6 and FIG. 7 are schematic views illustrating the data retention characteristics.
Figure 7:
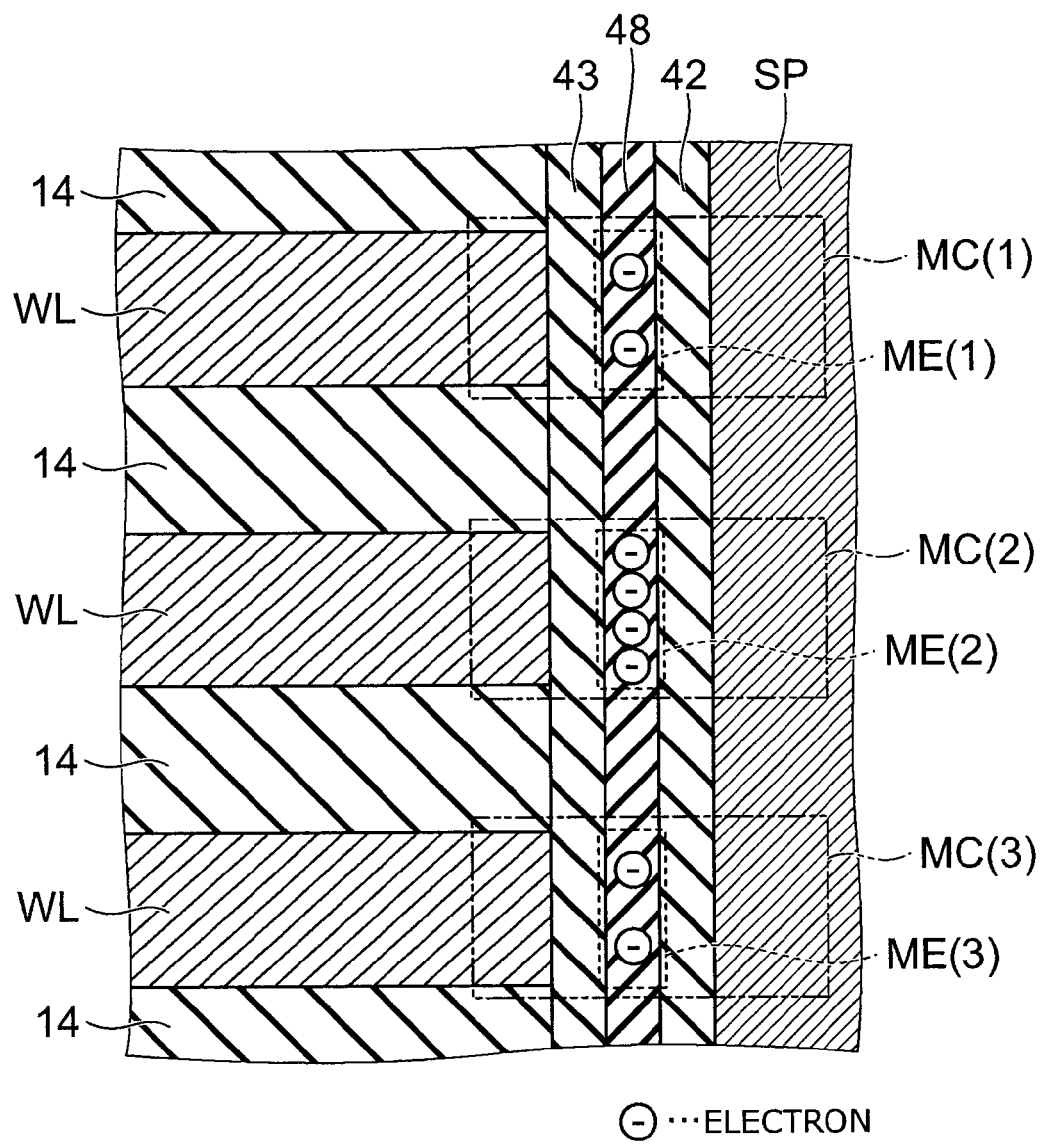

Data retention characteristics will now be described. FIG. 6 and FIG. 7 are schematic views illustrating the data retention characteristics.

These drawings are enlarged views of a memory cell portion, and illustrate only the portion of memory cells MC(1) to (3) corresponding to three electrode films WL on one side of one semiconductor pillar SP. The movement of electrons and electron holes are illustrated schematically.

In one memory cell MC, the charge storage film 48 at the position of the electrode film WL is the storage region ME. The programming is performed by at least one selected from injecting electrons into the storage region ME and removing electron holes from the storage region ME. In the example illustrated in FIG. 6 and FIG. 7, electrons are injected into the storage region ME during the programming. The erasing is performed by at least one selected from removing electrons from the storage region ME and injecting electron holes into the storage region ME. In the example illustrated in FIG. 6 and FIG. 7, electron holes are injected into the storage region ME during the erasing.

In the example illustrated in FIG. 6, the memory cell MC(2) of the central portion of the drawing is in a programmed state in which electrons are injected into the storage region ME(2). On the other hand, the memory cell MC(1) and the memory cell MC(3) adjacent thereto are in an erased state in which electron holes are injected into the storage region ME(1) and the storage region ME(3).

In the memory cell MC(2) which is in the programmed state, the threshold of the memory cell transistor is set according to the amount of the electrons injected into the storage region ME(2). In such a state, in the case where electron holes are stored in the storage regions ME(1) and (3) of the memory cells MC(1) and (3) adjacent to the memory cell MC(2), the electrons stored in the storage region ME(2) of the memory cell MC(2) are easily attracted toward the adjacent memory cells MC(1) and (3).

In other words, the state in which the polarity of the charge stored in the adjacent memory cells MC(1) and (3) is opposite to that of the charge stored in the memory cell MC(2), which is in the programmed state, can be said to be a state in which electrons are easily removed from the storage region ME(2) of the memory cell MC(2).

In the case where the electrons stored in the storage region ME(2) are undesirably removed as in the example illustrated in FIG. 6, the threshold of the memory cell transistor of the memory cell MC(2) undesirably fluctuates from the initial value, which leads to the erroneous detection of the information during the read out. It is conceivable that this may harm the data retention characteristics.

Although the memory cell MC(2) of the central portion of the drawing in the example illustrated in FIG. 7 is in the programmed state in which electrons are injected into the storage region ME(2) similarly to the example illustrated in FIG. 6, the memory cell MC(1) and the memory cell MC(3) adjacent thereto are in states in which a slight amount of electrons are injected into the storage region ME(1) and the storage region ME(3).

That is, in the case where the polarity of the charge stored in the adjacent memory cells MC(1) and (3) is the same as that of the charge stored in the memory cell MC(2), which is in the programmed state, electrons are not easily removed from the storage region ME(2) of the memory cell MC(2).

The ease or difficulty of removing electrons from the memory cell MC(2), which is in the programmed state, toward the adjacent memory cells MC(1) and (3) may be considered to be relative. Accordingly, electrons are easier to remove as the potential difference due to the amount of charge between the storage region ME(2) of the memory cell MC(2) and the storage regions ME(1) and (3) of the adjacent memory cells MC(1) and (3) increases and are more difficult to remove as the potential difference decreases.

In the nonvolatile semiconductor memory device 110 according to this embodiment, the state illustrated in FIG. 7 is made by performing the A-programming to the adjacent cell by applying a principle such as that recited above regarding the relationship between the programmed cells and the at least one cell before being programmed adjacent thereto (the adjacent cell). Thereby, the potential difference with the programmed cells can be lower than that of the state prior to the programming; and a state can be obtained in which the electrons are not easily removed from the programmed cells.

COMPARATIVE EXAMPLE

Figure 8A:
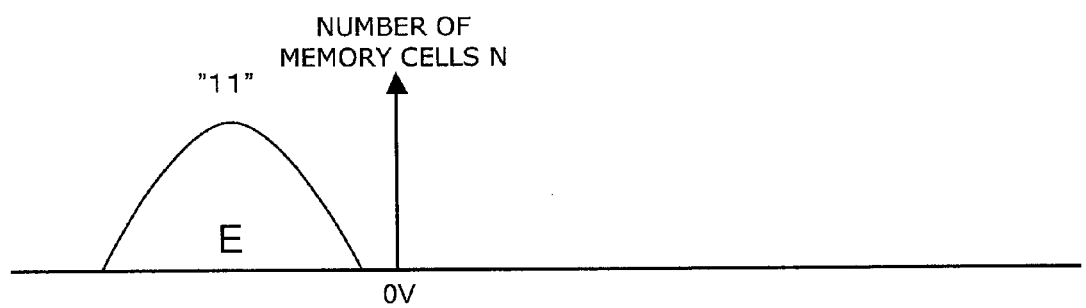
FIGS. 8A and 8B are schematic views illustrating an example of threshold distributions of a comparative example.
Figure 8B:
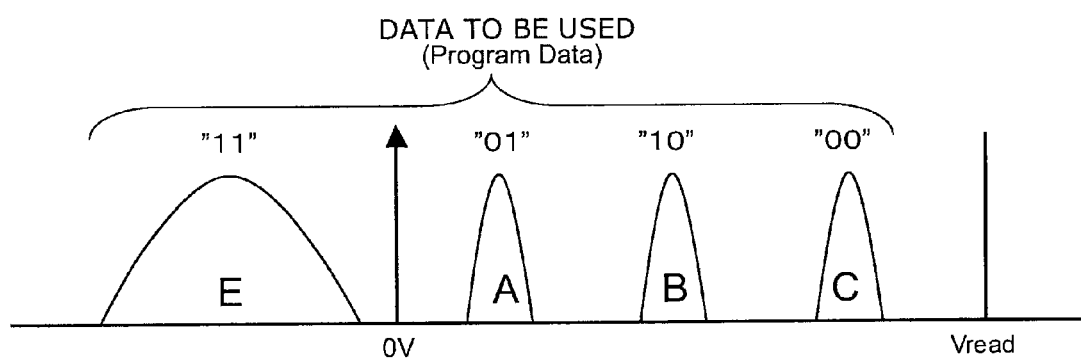

FIGS. 8A and 8B are schematic views illustrating an example of the threshold distributions of a comparative example.

In the comparative example, the four-valued information is programmed to the memory cells; and the erase threshold E and the thresholds A to C of the information to be programmed are utilized. In other words, a total of four thresholds are utilized; and the thresholds representing the four-valued information include the erase threshold E and the thresholds A to C.

In the comparative example, "11" from the four-valued information is represented by the erase threshold E, "01" is represented by the threshold A, "10" is represented by the threshold B, and "00" is represented by the threshold C.

First, as illustrated in FIG. 8A, the collective erasing of the information of the multiple memory cells is performed. By the erasing operation, the thresholds of the memory cell transistors are set to the threshold E. At this time, this is a state in which the distribution of the threshold E is on the negative polarity side and the distribution width thereof is relatively wide.

Then, as illustrated in FIG. 8B, the programming of the information is performed to the cells to be programmed. By the programming of the information, the thresholds of the memory cell transistors of the cells to be programmed become one selected from the thresholds corresponding to the four-valued information.

Here, because "11" from the four values is represented by the erase threshold E, the programming is substantially not performed for the cells to be programmed when programming "11." In the memory cells to which the information of "01" from the four values is programmed, the thresholds of the memory cell transistors are set to the threshold A of the positive polarity side.

In the memory cells to which the information of "10" from the four values is programmed, the thresholds of the memory cell transistors are set to the threshold B which is higher than the distribution of the threshold A. In the memory cells to which the information of "00" from the four values is programmed, the thresholds of the memory cell transistors are set to the threshold C which is higher than the distribution of the threshold B.

In such a comparative example, because the thresholds of the memory cell transistors of the cells before being programmed are set to the erase threshold E (the negative pole), the polarity of the stored charge between the adjacent cells of the programmed cells and the cells before being programmed are opposite in the case where the memory cell transistors of the programmed cells are set to the thresholds A to C (the positive pole); and this is a state in which electrons are easily removed from the storage regions of the programmed cells (referring to FIG. 6).

Further, in the programmed cells of the comparative example, in the case where, for example, the distribution of the erase threshold E representing "11" is adjacent to the distribution of the thresholds A to C representing the others, the polarity of the stored charge between adjacent cells is opposite similarly to those recited above; and this is a state in which the removal of the electrons may occur.

Threshold Distribution of the First Embodiment

Figure 9A:
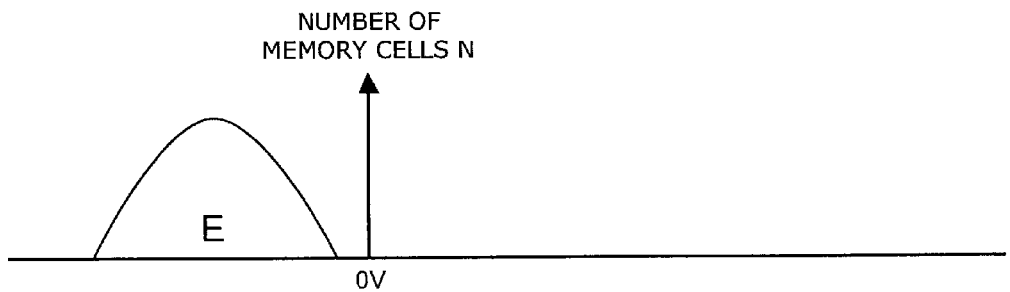
FIGS. 9A and 9B are schematic views illustrating an example of threshold distributions of a first embodiment.
Figure 9B:
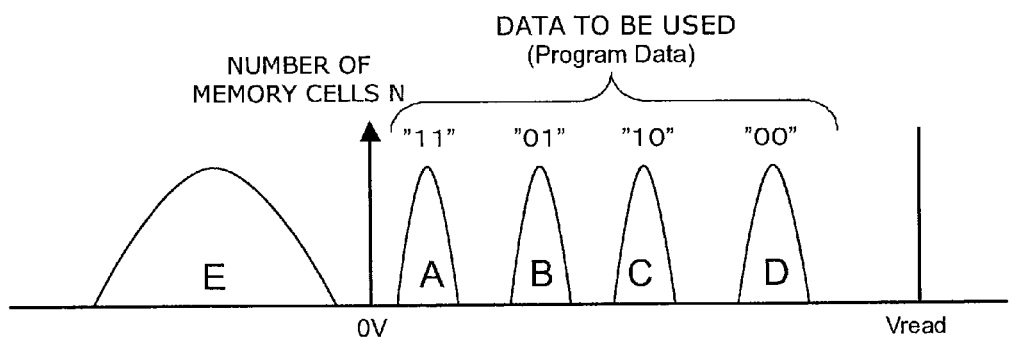

FIGS. 9A and 9B are schematic views illustrating an example of threshold distributions of the first embodiment.

Compared to the comparative example described above, the threshold distributions illustrated in FIGS. 9A and 9B utilize the thresholds A to D of the information to be programmed in addition to the erase threshold E. In other words, a total of five thresholds are utilized; and the thresholds representing the four-valued information include the thresholds A to D and do not include the erase threshold E.

For the four-valued information, "11" is represented by the threshold A, "01" is represented by the threshold B, "10" is represented by the threshold C, and "00" is represented by the threshold D.

First, as illustrated in FIG. 9A, the collective erasing of the multiple memory cells is performed. By the erasing operation, the thresholds of the memory cell transistors are set to the threshold E. At this time, this is a state in which the distribution of the threshold E is on the negative polarity side and the distribution width thereof is relatively wide.

Continuing as illustrated in FIG. 9B, the programming of the information is performed to the cells to be programmed. By the programming of the information, the thresholds of the memory cell transistors of the cells to be programmed become one selected from the thresholds corresponding to the four-valued information. In the example illustrated in FIG. 9B, "11" from the four values is set in the distribution of the threshold A, "01" is set in the distribution of the threshold B, "10" is set in the distribution of the threshold C, and "00" is set to the threshold D.

Then, after the desired information is programmed to the cells to be programmed, the information providing the threshold A is programmed to at least one cell before being programmed (the adjacent cell) adjacent to the cells to be programmed (the A-programming operation). Thereby, the thresholds in the cells to be programmed and the adjacent cell are contained in one selected from A to D; and all of these are threshold distributions of the positive polarity side. Accordingly, the stored charge of the programmed cells has the same polarity as that of all of the cells adjacent thereto; and this is a state in which the electrons are not easily removed from the storage regions of the programmed cells (referring to FIG. 7).

Threshold Distributions of Another Example (Part 1) of the First Embodiment

Figure 10A:
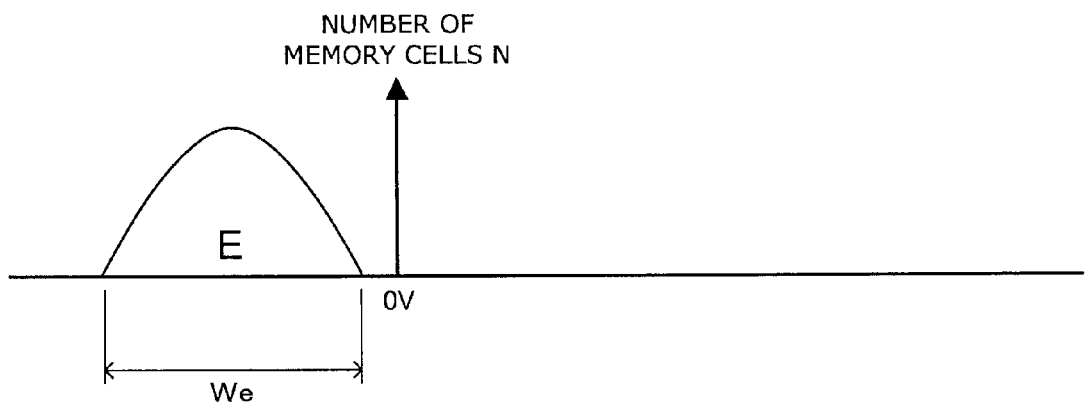
FIG. 10A to FIG. 11C are schematic views illustrating an example of threshold distributions of other examples of the first embodiment.
Figure 10B:
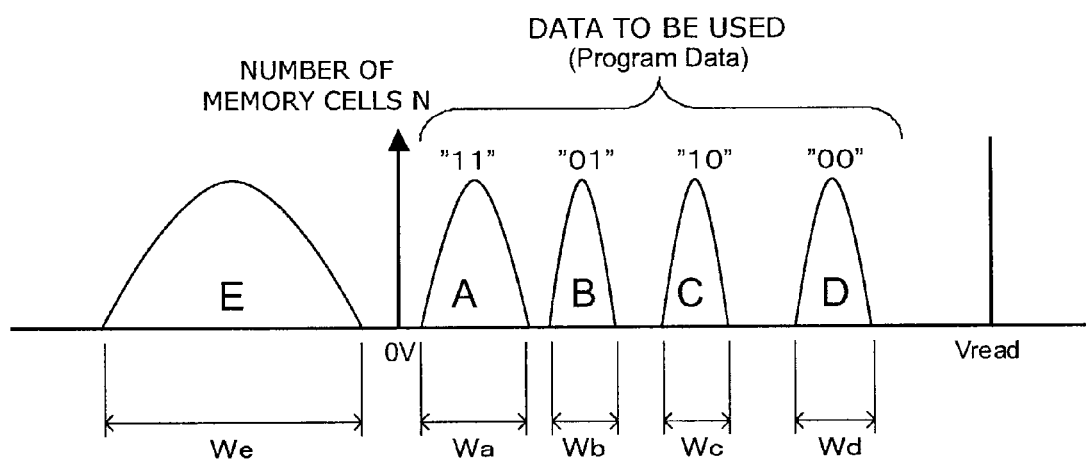

FIGS. 10A and 10B are schematic views illustrating an example of threshold distributions of another example (part 1) of the first embodiment.

Although the thresholds A to D of the information to be programmed are utilized in addition to the erase threshold E in this example similarly to the threshold distributions illustrated in FIGS. 9A and 9B, this example differs in that the width of the distribution of the threshold A is wide.

First, as illustrated in FIG. 10A, the collective erasing of the information of the multiple memory cells is performed. By the erasing operation, the thresholds of the memory cell transistors are set to the threshold E. At this time, this is a state in which the distribution of the threshold E is on the negative polarity side and a width We of the distribution is relatively wide.

Then, as illustrated in FIG. 10B, the programming of the information is performed to the cells to be programmed. By the programming of the information, the thresholds of the memory cell transistors of the cells to be programmed become one selected from the thresholds corresponding to the four-valued information. In the example illustrated in FIG. 10B, "11" from the four values is set in the distribution of the threshold A, "01" is set in the distribution of the threshold B, "10" is set in the distribution of the threshold C, and "00" is set in the distribution of the threshold D.

Here, when setting to the threshold A representing "11," a width Wa of the distribution of the threshold A is set to be narrower than the width We of the distribution of the erase threshold E and wider than widths Wb, Wc, and Wd of the distributions of the thresholds B, C, and D. Specifically, when setting to the threshold A, the verify operations of the programming are more than the verify operations of the erasing and fewer than the verify operations of the programming of the thresholds B to D.

Then, after programming the desired information to the cells to be programmed, the information providing the threshold A is programmed to the at least one cell before being programmed (the adjacent cell) adjacent to the cells to be programmed (the A-programming operation). Thereby, this state is a state in which all of the distributions of the thresholds in the cells to be programmed and the adjacent cell are on the positive polarity side and the electrons are not easily removed from the storage regions of the programmed cells (referring to FIG. 7). Also, in the example illustrated in FIGS. 10A and 10B, because the width Wa of the distribution of the threshold A is wider than the widths Wb to Wd of the distributions of the thresholds B to D in the programming operation and the A-programming operation, the processing time of each of the operations is shorter than that of the example illustrated in FIGS. 9A and 9B.

Threshold Distributions of Another Example (Part 2) of the First Embodiment

Figure 11A:
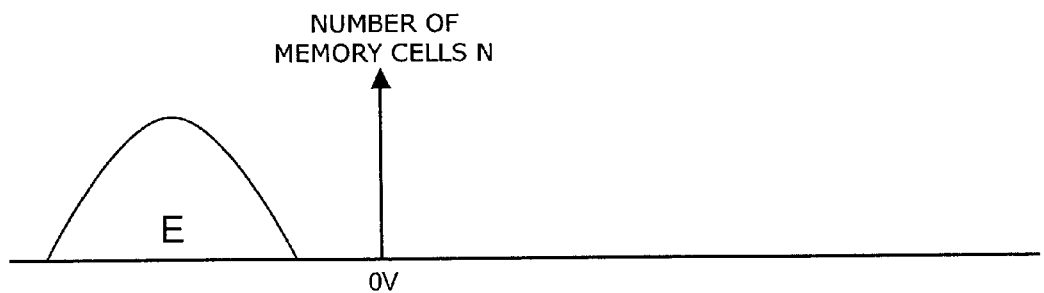
Figure 11B:
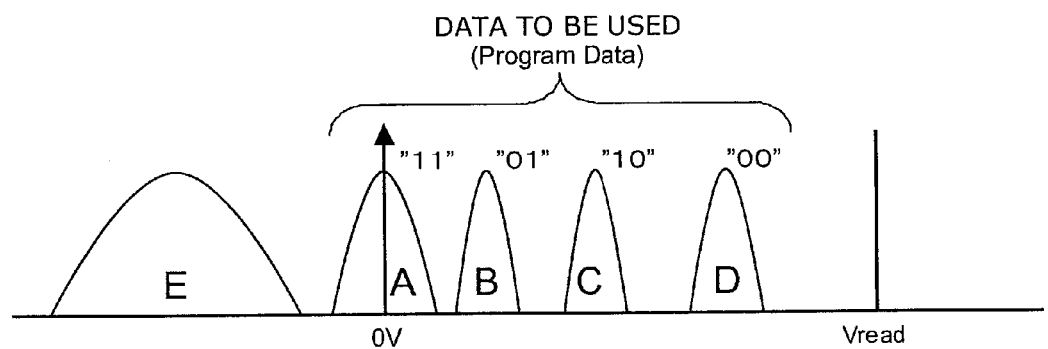
Figure 11C:
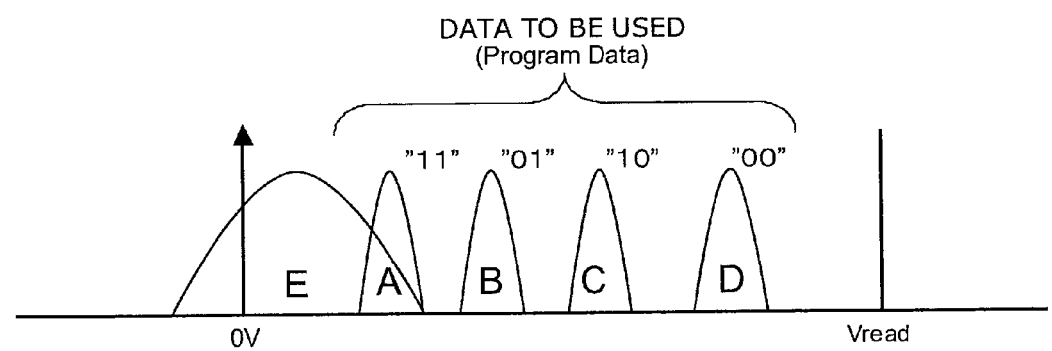

FIGS. 11A to 11C are schematic views illustrating an example of threshold distributions of another example (part 2) of the first embodiment.

In this example, although the thresholds A to D of the information to be programmed are utilized in addition to the erase threshold E similarly to the threshold distributions illustrated in FIGS. 10A and 10B, this example differs in that the distribution of the threshold A is a distribution straddling 0 V.

First, as illustrated in FIG. 11A, the collective erasing of the information of the multiple memory cells is performed. By the erasing operation, the thresholds of the memory cell transistors are set to the threshold E. At this time, this is a state in which the distribution of the threshold E is on the negative polarity side and the distribution width is relatively wide.

Then, as illustrated in FIG. 11B, the programming of the information is performed to the cells to be programmed. By the programming of the information, the thresholds of the memory cell transistors of the cells to be programmed become one selected from the thresholds corresponding to the four-valued information. In the example illustrated in FIG. 11B, "11" from the four values is set in the distribution of the threshold A, "01" is set in the distribution of the threshold B, "10" is set in the distribution of the threshold C, and "00" is set in the distribution of the threshold D.

Here, when setting the threshold A representing "11," the distribution of the threshold A is a distribution straddling 0 V. Similarly to the example illustrated in FIGS. 10A and 10B, the distribution of the threshold A may be narrower than the width of the distribution of the erase threshold E and wider than the widths of the distributions of the thresholds B to D. Also, the widths of the distributions of the thresholds B to D may be the same. In either case, the distribution of the threshold A straddles 0 V.

Then, after programming the desired information to the cells to be programmed, the information providing the threshold A is programmed to the at least one cell before being programmed (the adjacent cell) adjacent to the cells to be programmed (the A-programming operation). In this example, the threshold distributions of the cells to be programmed and the adjacent cell are almost entirely on the positive polarity side. However, only a portion of the distribution of the threshold A is a threshold of the negative polarity side. Even in the case where a portion of the distribution of the threshold A is a threshold of the negative polarity side, a state can be obtained in which the electrons are not easily removed from the storage regions of the programmed cells compared to the case where the adjacent cell has the distribution of the threshold E because the threshold is more to the positive polarity side than is the distribution of the erase threshold E.

It is not always necessary for the entire distribution of the erase threshold E to be on the negative polarity side. For example, as illustrated in FIG. 11C, a portion of the distribution of the erase threshold E may be on the negative polarity side and the other portion may be on the positive polarity side. Also, as illustrated in FIG. 11B, a portion of the distribution of the erase threshold E on the positive polarity side may overlap a portion of the distribution of the threshold A on the threshold E side.

Second Embodiment

An example of a nonvolatile semiconductor memory device according to a second embodiment will now be described. The configuration of the nonvolatile semiconductor memory device according to the second embodiment may be applied not only to the configuration of the nonvolatile semiconductor memory device according to the embodiment described using FIG. 2 to FIG. 5 but also to the configuration of a nonvolatile semiconductor memory device which has no connection portion and no back gate BG and includes NAND strings having I-shaped configurations in which each of the semiconductor pillars is independent and the configuration of a planar nonvolatile semiconductor memory device in which a MONOS structure is provided in a planar configuration. The descriptions hereinbelow focus on points different from the operations of the nonvolatile semiconductor memory device according to the first embodiment.

Figure 12A:
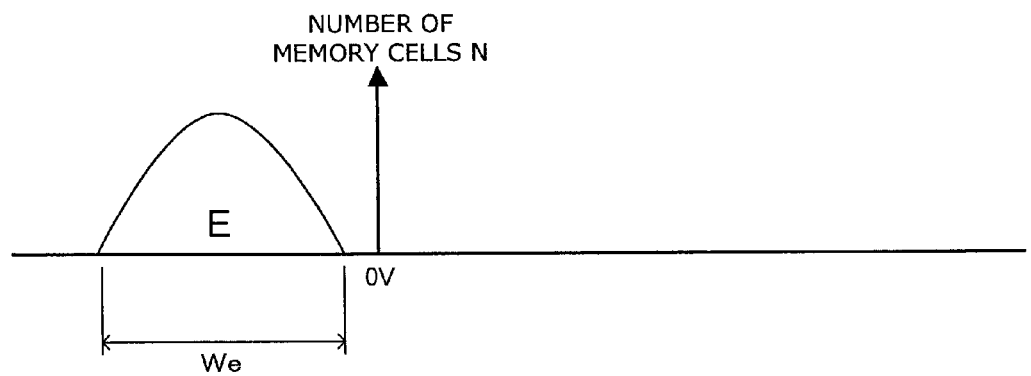
FIGS. 12A to 12C are schematic views illustrating an example of threshold distributions of a second embodiment.
Figure 12B:
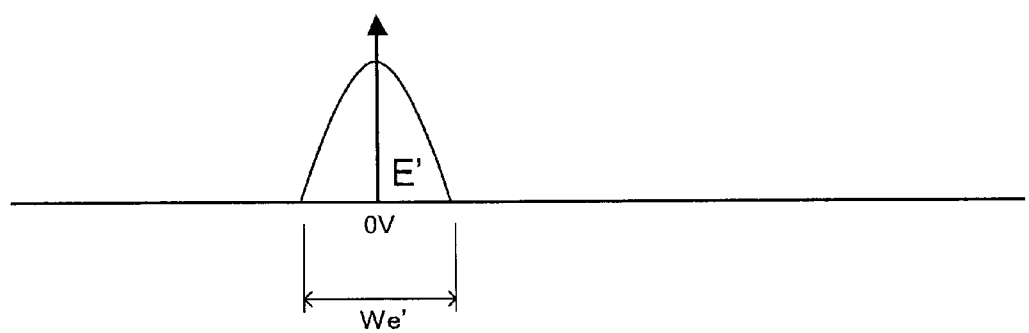
Figure 12C:
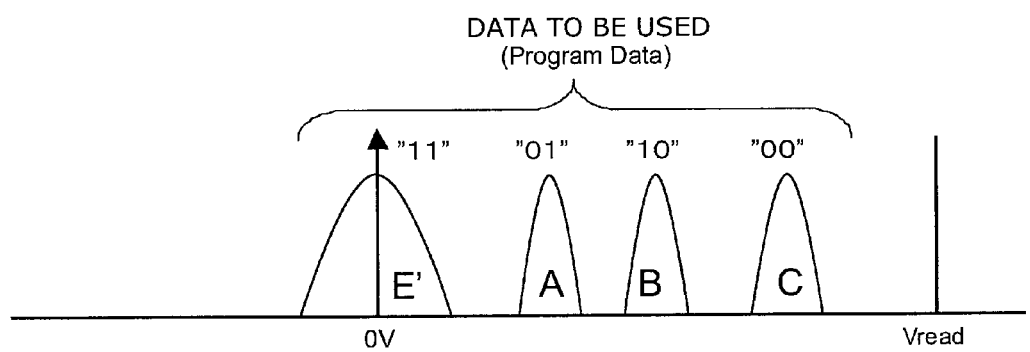

FIGS. 12A to 12C are schematic views illustrating an example of threshold distributions of the second embodiment. FIGS. 13A to 13D are schematic views illustrating an example of the transition of the information of the memory cells. These drawings illustrate an equivalent circuit to describe this embodiment; and the string is simplified for description by being illustrated as a circuit extending in one direction. This does not represent the actual configuration.

The threshold distributions of the second embodiment correspond to programming four-valued information to the memory cells, where a threshold E' shifted from the erase threshold E toward the positive polarity side and the thresholds A to C of the information to be programmed are utilized. In other words, a total of four thresholds are utilized; and the thresholds representing the four-valued information include the threshold E' and the thresholds A to C.

For the four-valued information, "11" is represented by the threshold E', "01" is represented by the threshold A, "10" is represented by the threshold B, and "00" is represented by the threshold C.

First, as illustrated in FIG. 12A, the collective erasing of the information of the multiple memory cells is performed. By the erasing operation, the thresholds of the memory cell transistors are set to the threshold E. At this time, this is a state in which the distribution of the threshold E is on the negative polarity side and the width We of the distribution is relatively wide.

FIG. 13A illustrates the state of the information of the memory cells when the collective erasing is performed.

As illustrated in this drawing, in the case where the collective erasing of the multiple memory cells is performed in a string in which the multiple memory cells are connected in series, all of the thresholds of the multiple memory cell transistors Tr are set in the distribution of the threshold E.

Then, as illustrated in FIG. 12B, the information of the multiple memory cells is set to the threshold E'. The threshold E' is more toward the positive polarity side than is the distribution of the erase threshold E and represents the information from the four-valued information that provides a threshold nearest to the distribution of the erase threshold E, i.e., in this case, "11." A width We' of the distribution of the threshold E' may be narrower than the width We of the distribution of the erase threshold E, may be wider than the widths of the distributions of the thresholds A to C, or may have the same width as the distributions of the thresholds A to C.

Although the distribution of the threshold E' is set to straddle 0 V in the example illustrated in FIG. 12B, the entire distribution may be set to be on the positive polarity side. By such an operation, the thresholds of the multiple memory cells are set to E'.

FIG. 13B illustrates the state of the information of the memory cells when the programming (the E'-programming) of the information providing the threshold E' is performed.

As illustrated in this drawing, by performing the E'-programming, all of the thresholds of the multiple memory cell transistors Tr are set in the distribution of the threshold E'. In such a case, the increase of the number of the verify operations is suppressed and the E'-programming can be completed in a relatively short period of time because the width We' of the distribution of the threshold E' is narrower than the width We of the distribution of the erase threshold E and wider than the widths of the distributions of the thresholds A to C.

Then, as illustrated in FIG. 12C, the programming of the information is performed to the cells to be programmed. By the programming of the information, the thresholds of the memory cell transistors of the cells to be programmed become one selected from the distribution of the thresholds corresponding to the four-valued information. Here, because "11" from the four values is represented by the threshold E', the programming is substantially not performed for the cells to be programmed when programming the "11." In the memory cells in which the information of "01" from the four values is programmed, the thresholds of the memory cell transistors are set in the distribution of the threshold A of the positive polarity side. Thereby, the thresholds of the programmed cells are set to E' or one selected from A to C.

The state of the information of the memory cells when the programming is performed is illustrated in FIG. 13C.

By performing the programming as illustrated in this drawing, the thresholds of the memory cell transistors Tr of the programmed cells are set to the distribution of the threshold E' or one selected from the thresholds A to C. Because "11" from the four values is represented by the threshold E', the programming is substantially not performed for the cells to be programmed when programming the "11."

In the state in which the information is programmed, all of the thresholds of the memory cell transistors Tr of the cells before being programmed including the adjacent cell adjacent to the programmed cells are the threshold E' as-is in the state of the previous E'-programming.

Here, focusing on the memory cell at the end of the cells to be programmed and the cell before being programmed adjacent to the memory cell at the end, the difference of the set thresholds is a difference having the threshold E' of the adjacent cell as a reference. In other words, the difference is smaller than when the erase threshold E is the reference.

In the example illustrated in FIG. 13C, the threshold of the memory cells at the end of the cells to be programmed is C; and the threshold of the cell before being programmed adjacent thereto is E'. Thereby, the difference of the thresholds between the memory cell at the end of the cells to be programmed and the adjacent cell is C-E'.

Here, because the distribution of the threshold E' is shifted more toward the thresholds A to C side (the positive polarity side) than is the distribution of the erase threshold E, this is a state in which the difference of the thresholds is smaller than the case where the adjacent cell is as-is at the erase threshold E; and the electrons are not easily removed from the storage regions of the programmed cells (referring to FIG. 7).

Then, the additional programming is performed. As illustrated in FIG. 13D, the additional programming is performed on the cells to be programmed including the adjacent cell of the programmed cells. Here, the cells to be programmed including the adjacent cell have the threshold E' due to the previous E'-programming. Because "11" from the four values is represented by the threshold E', the programming is substantially not performed for the cells to be programmed when programming "11."

Because the threshold E' which has the lowest voltage of the four-valued information is utilized in the E'-programming, it is sufficient for the processing to increase the charge injected into the storage region when reprogramming to the other information (A to C). That is, the additional programming of the desired information can be performed as-is without performing the erasing operation.

Third Embodiment

An example of a nonvolatile semiconductor memory device according to a third embodiment will now be described. The nonvolatile semiconductor memory device according to the third embodiment is a nonvolatile semiconductor memory device including the connection portion CP and the back gate BG described using FIG. 2 to FIG. 5. The descriptions hereinbelow focus on points different from the operations of the nonvolatile semiconductor memory device according to the first embodiment.

FIGS. 14A to 14D are schematic views illustrating an example of the transition of the information of the memory cells (part 1); and FIGS. 15A to 15D are schematic views illustrating the example of the transition of the information of the memory cells (part 2). FIGS. 14A to 14D and FIGS. 15A to 15D illustrate equivalent circuits to describe this embodiment; and the strings are simplified for description by being illustrated as circuits extending in one direction. This does not represent the actual configuration.

The description herein is an operational example of a configuration in which the back gate BG is provided in the center of the string and the multiple memory cell transistors Tr are connected in series on one side and on one other side centered on the back gate BG. Such a string is, for example, a NAND string having a U-shaped configuration formed of the first and second semiconductor pillars SP1 and SP2 and the connection portion CP as illustrated in FIG. 3. The back gate BG is provided opposing the connection portion CP. Because the back gate BG has the same configuration as the memory cell transistor Tr, some kind of information can be programmed in the storage layer corresponding to the back gate BG as necessary. This region where the information can be programmed is taken to be the storage region corresponding to the back gate BG for convenience of description.

Any of the threshold distributions of the first embodiment illustrated in FIG. 9A to FIG. 11C also may be used as the erase threshold E and the thresholds A to D corresponding to the four-valued information in the nonvolatile semiconductor memory device according to the third embodiment. As an example, the thresholds illustrated in FIGS. 9A and 9B are used in the description of this embodiment. The programming of the four-valued information (the programming) is performed in order from the memory cell on the source side or the memory cell on the drain side. The programming also may be performed to randomly-accessed memory cells. The case of the programming being performed in order from the memory cell on the source side is described as an example in this embodiment.

First, the operations in the case where the programming of the four-valued information stops at the end portion of the back gate BG will be described based on FIGS. 14A to 14D.

As illustrated in FIG. 14A, the control unit CTU (referring to FIG. 2) performs the collective erasing of the multiple memory cells of the string. By the erasing operation, the thresholds of the multiple memory cell transistors Tr are set to the threshold E. Here, for the storage region corresponding to the back gate BG, there are cases where the erasing operation is performed and cases where the erasing operation is not performed.

Then, the control unit CTU performs the programming of the information to the cells to be programmed of the string. In the example illustrated in FIG. 14B, the state is illustrated in which the programming is performed for the memory cells from the source side up to the memory cell before the back gate BG.

Continuing, the control unit CTU performs the A-programming as necessary (referring to FIG. 14C). Here, the adjacent cell on which the A-programming is to be performed corresponds to the storage region corresponding to the back gate BG. In the case where the erasing operation is not performed to the storage region corresponding to the back gate BG in the previous collective erasing, the A-programming may or may not be performed to the storage region corresponding to the back gate BG corresponding to the adjacent cell.

On the other hand, in the case where the erasing operation is performed to the storage region corresponding to the back gate BG in the previous collective erasing, the A-programming is performed to the storage region corresponding to the back gate BG corresponding to the adjacent cell. Thereby, the difference of the set thresholds, i.e., the difference of the charge, between the memory cell at the end of the programmed cells and the storage region corresponding to the back gate BG adjacent to the memory cell at the end is smaller than that of the state directly after the programming.

Then, the control unit CTU performs the additional programming (referring to FIG. 14D). The additional programming starts from the first memory cell after the back gate BG. The additional programming can be executed by a method similar to the programming. Thereby, the cells to be programmed in the additional programming have one selected from the thresholds A to D of the four values.

Operations of the case where the programming of the four-valued information straddles the back gate BG will now be described based on FIGS. 15A to 15D.

As illustrated in FIG. 15A, the control unit CTU performs the collective erasing of the multiple memory cells of the string. By the erasing operation, the thresholds of the multiple memory cell transistors Tr are set to the threshold E. Here, for the storage region corresponding to the back gate BG, there are cases where the erasing operation is performed and cases where the erasing operation is not performed.

Then, the control unit CTU performs the programming of the information to the cells to be programmed of the string. In the example illustrated in FIG. 15B, the state is illustrated in which the programming is performed from the source side up to memory cells straddling the back gate BG. Here, the programming of the information providing the threshold A may be performed to the storage region corresponding to the back gate BG.

Continuing, the control unit CTU performs the A-programming (referring to FIG. 15C). Here, the information for which the thresholds of the memory cell transistors become the threshold A is programmed to the adjacent cell of the programmed cells on which the programming is performed.

In this A-programming, the A-programming is performed also to the storage region corresponding to the back gate BG as necessary. In other words, in the case where the erasing operation was not performed to the storage region corresponding to the back gate BG in the previous collective erasing, the A-programming may or may not be performed to the storage region corresponding to the back gate BG. Further, in the case where the programming of the information providing the threshold A was performed to the storage region corresponding to the back gate BG during the previous programming, it is unnecessary to perform the A-programming to the storage region corresponding to the back gate BG.

On the other hand, in the case where the erasing operation is performed in the previous collective erasing and the information providing the threshold A is not programmed to the storage region corresponding to the back gate BG, the A-programming is performed to the storage region corresponding to the back gate BG corresponding to the adjacent cell. Thereby, the difference of the set thresholds, i.e., the difference of the charge, between the storage region corresponding to the back gate BG and the memory cell adjacent thereto, which are included in the programmed cells, is smaller than that of the state directly after the programming.

Because the additional programming described below is not performed to the storage region corresponding to the back gate BG which is included in the programmed cells, the width of the distribution of the threshold A may be wider than those of the distributions of the thresholds B to D of the other information for the programming and the A-programming performed to the storage region corresponding to the back gate BG. Thereby, the number of verifies of the programming and the A-programming can be less than the number of verifies of the thresholds B to D and the program time can be shortened.

Then, the control unit CTU performs the additional programming (referring to FIG. 15D). The additional programming starts from the cell of the latter stage adjacent to the series of data on which the programming straddling the back gate BG was performed previously and for which the A-programming was performed. The information having the desired 4 values is programmed to the cells to be programmed in the latter stage including the adjacent cell. Thereby, the cells to be programmed in the additional programming have one selected from the thresholds A to D of the four values.

Thus, in the nonvolatile semiconductor memory device in which the back gate BG is provided in the center of the string, this is a state in which the electrons are not easily removed from the storage regions of the programmed cells (referring to FIG. 7) because the difference of the stored charge between the cells to which the information is programmed and the storage region corresponding to the back gate BG is smaller than those of the states directly after the collective erasing and directly after the programming; and the data retention characteristics improve.

Although all of the embodiments described above are examples in which all of the threshold distributions representing the multi-bit information or all but a portion are on the positive polarity side, the invention is not limited thereto. This is similar even in the case where all of the threshold distributions representing the multi-bit information or all but a portion are set to be on the negative polarity side.

Drive Circuit Configuration

Figure 16:
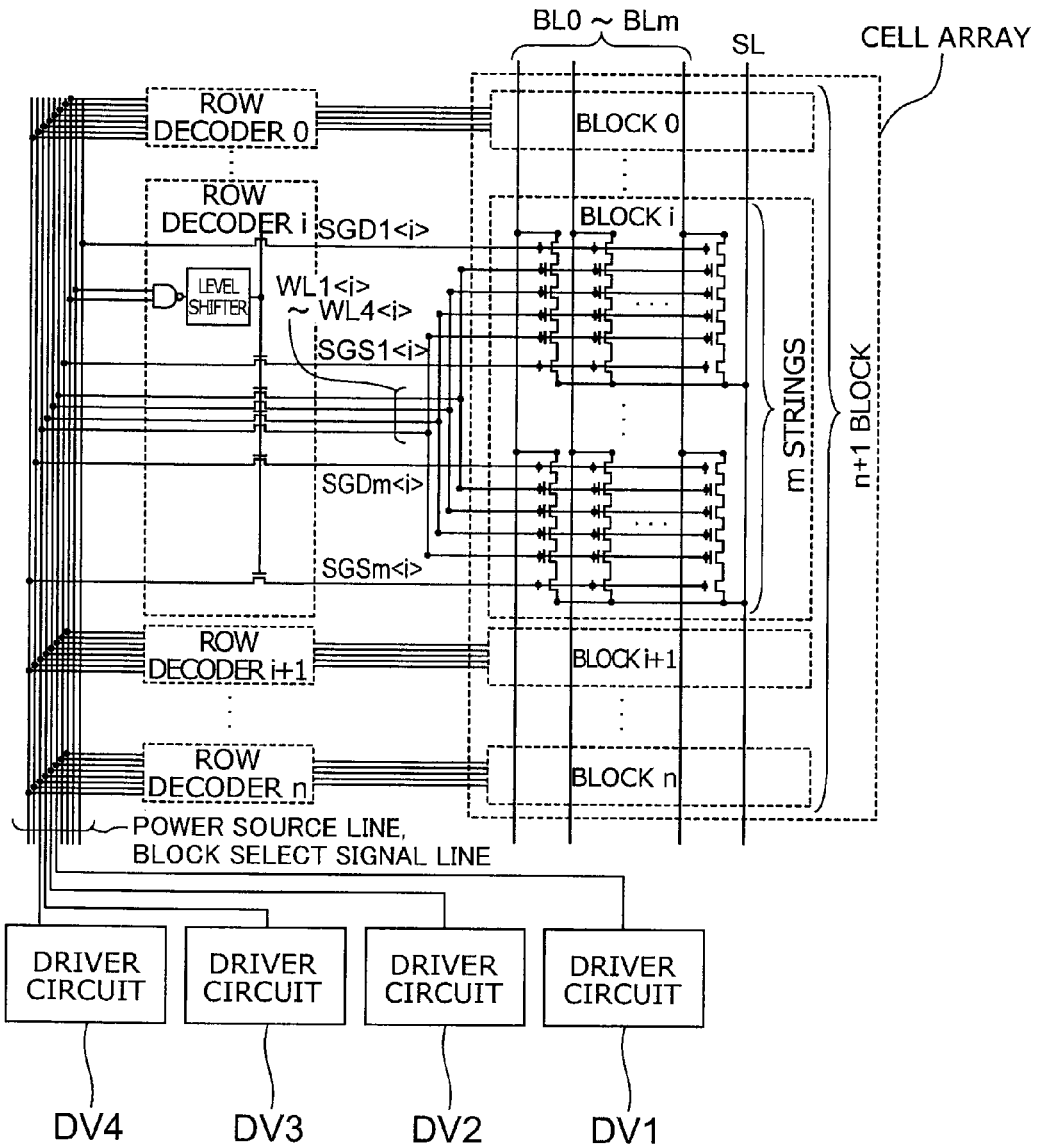
FIG. 16 is a circuit diagram illustrating a drive circuit configuration of the nonvolatile semiconductor memory device according to the embodiment.

FIG. 16 is a circuit diagram illustrating a drive circuit configuration of the nonvolatile semiconductor memory device according to this embodiment. In other words, the nonvolatile semiconductor memory device includes a cell array and decoders. The cell array includes n (n being an integer not less than 1) blocks including m (m being an integer not less than 1) strings. In one string, multiple memory cells are provided; and the memory cell transistors of the memory cells are connected in series. The thresholds of the memory cell transistors fluctuate due to the information set in the memory cells.

The decoders are the row decoders; a decoder is provided every block of the cell array; and n decoders are provided. That is, a row decoder 0 is provided corresponding to a block 0, a row decoder 1 is provided corresponding to a block 1, . . . , a row decoder i is provided corresponding to a block . . . , and a row decoder n is provided corresponding to a block n.

The row decoder i connected to the block i provides signals SGD1<i> to SGDm<i> to the drain-side selection gate electrodes SGD of the m strings of the block i and provides the signals SGS1<i> to SGSm<i> to the source-side selection gate electrodes SGS. The row decoder i provides signals to the electrode films WL of the block i in the unit of layers. Because there are four layers of electrode films WL in the example illustrated in FIG. 16, signals WL1<i> to WL4<i> are provided. The row decoders other than the row decoder i have similar configurations; and signals similar to those recited above are applied to the corresponding blocks.

Bit lines BL0 to BLm have common connections to the m strings of each of the blocks for the blocks 0 to n of the cell array; and the source line SL has a common connection to the blocks.

Driver circuits DV1 to DV4 control the signals sent to the bit lines BL0 to BLm and the source line SL and control the row decoders. The driver circuits DV1 to DV4 are circuits configured to control the signals WL1<i> to WL4<i> of each of the blocks 0 to n. The driver circuit DV1 controls the signal WL1<i> of each of the blocks 0 to n; the driver circuit DV2 controls the signal WL2<i> of each of the blocks 0 to n; the driver circuit DV3 controls the signal WL3<i> of each of the blocks 0 to n; and the driver circuit DV4 controls the signal WL4<i> of each of the blocks 0 to n. The signals output from the driver circuits DV1 to DV4 are sent to the signals WL1<i> to WL4<i> of each of the blocks 0 to n via the row decoders 0 to n, respectively.

The driver circuit may be provided in the same chip as the nonvolatile semiconductor memory device or may be provided outside the chip.

In the nonvolatile semiconductor memory device according to this embodiment, the memory cell transistors are set to the thresholds corresponding to the information having n values (e.g., 4 values); and in such a state, the information of the at least one cell before being programmed adjacent to the memory cells in which the information is programmed is controlled to have a value providing a threshold of the memory cell transistor nearer than the erase threshold to the thresholds corresponding to the information having the n values.

In the example illustrated in FIGS. 13A to 13D, the signals WL1<i> to WL4<i> to the electrode films WL sent from each of the row decoders 0 to n to each of the blocks 0 to n are controlled to be voltages corresponding to the set thresholds by instructions from the driver circuits DV1 to DV4.

Although the embodiments described above are examples in which the nonvolatile semiconductor memory device mainly includes a NAND string having a U-shaped configuration in which two semiconductor pillars are connected by a connection portion, this may be applied also to a nonvolatile semiconductor memory device which has no connection portion and includes NAND strings having I-shaped configurations in which each of the semiconductor pillars is independent.

This is applicable not only to the configuration in which a stacked structural body including the electrode film WL alternately stacked with the inter-electrode insulating film 14 is pierced by semiconductor pillars but also to, for example, a planar nonvolatile semiconductor memory device having a MONOS structure in which multiple storage regions are provided in a continuous storage layer having a planar configuration and electrode units are formed in the storage regions with an insulating film interposed therebetween.

In the nonvolatile semiconductor memory device according to this embodiment, the inter-electrode insulating film 14, the inner insulating film 42, and the outer insulating film 43 may include a single-layer film of one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film made of a plurality selected from the group.

The charge storage film 48 may include a single-layer film of one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate or a stacked film made of a plurality selected from the group.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nonvolatile semiconductor memory devices such as semiconductor substrates, electrode films, insulating films, insulating layers, stacked structural bodies, storage layers, charge storage layers, semiconductor pillars, word lines, bit lines, source lines, interconnects, memory cell transistors, selection gate transistors, and the like from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile semiconductor memory devices practicable by an appropriate design modification by one skilled in the art based on the nonvolatile semiconductor memory devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A nonvolatile semiconductor memory device, comprising
a memory unit and a control unit,
the memory unit including a plurality of strings,
the strings having:
a charge storage film; and
a memory cell transistor provided for each of a plurality of storage regions configured to store charge in the charge storage film, a threshold of the memory cell transistor fluctuating due to data set in the storage region,
the control unit being configured to:
set the memory cell transistors to an erase threshold by setting erase data in the plurality of storage regions of at least one of the strings;
subsequently set the memory cell transistors provided in the storage regions to thresholds corresponding to data having n (n being an integer not less than 2) values by programming the data having the n values to at least one of the storage regions of the strings in which the erase data is set; and
control data of at least one storage region before being programmed adjacent to the storage regions programmed with the data to have a value providing a threshold of the memory cell transistor nearer than the erase threshold to the thresholds corresponding to the data having the n values in the state of the memory cell transistors provided in the storage regions being set to the thresholds corresponding to the data having the n values.

2. The device according to claim 1, wherein the control unit is configured to control all of the thresholds of the transistors due to the data of the programmed storage regions and the threshold of the transistor due to the data of the at least one storage region before being programmed adjacent to the programmed storage regions to have one selected from a positive polarity and a negative polarity.

3. The device according to claim 1, wherein the control unit is configured to control the data of the at least one storage region before being programmed adjacent to the programmed storage regions to have a value providing a threshold of the memory cell transistor contained in a distribution straddling 0 V.

4. The device according to claim 1, wherein the control unit is configured to control the data of the at least one storage region before being programmed adjacent to the programmed storage regions to have a value providing the threshold nearest to the erase threshold of the thresholds of the memory cell transistors corresponding to the data having the n values.

5. The device according to claim 1, wherein the control unit is configured to control the data of the at least one storage region before being programmed adjacent to the programmed storage regions to have a value providing a threshold of the memory cell transistor contained in a range narrower than a distribution of the erase threshold and wider than distributions of the thresholds corresponding to the data having the n values.

6. The device according to claim 1, wherein the control unit is configured to set data in the plurality of storage regions to provide a threshold on a positive polarity side of the erase threshold after setting the memory cell transistors to the erase threshold by setting the erase data in the plurality of storage regions and prior to programming the data having the n values to the storage regions.

7. The device according to claim 6, wherein the data providing the threshold on the positive polarity side of the erase threshold set by the control unit is one selected from the data having the n values.

8. The device according to claim 6, wherein the control unit is configured to set a distribution of the threshold on the positive polarity side of the erase threshold to be narrower than a distribution of the erase threshold.

9. The device according to claim 1, wherein the control unit is configured to set the thresholds of the memory cell transistors to the erase threshold collectively for each of the strings.

10. A method for driving a nonvolatile semiconductor memory device,
the device including a plurality of string,
the strings having:
a charge storage film; and
a memory cell transistor provided for each of a plurality of storage regions configured to store charge in the charge storage film, a threshold of the memory cell transistor fluctuating due to data set in the storage regions, the method comprising:
setting the memory cell transistors to an erase threshold by setting erase data in the plurality of storage regions of at least one of the strings;
subsequently setting the memory cell transistors provided in the storage regions to thresholds corresponding to data having n (n being an integer not less than 2) values by programming the data having the n values to at least one of the storage regions of the strings; and
controlling data of at least one storage region before being programmed adjacent to the storage regions programmed with the data to have a value providing a threshold of the memory cell transistor nearer than the erase threshold to the thresholds corresponding to the data having the n values in the state of the memory cell transistors provided in the storage regions being set to the thresholds corresponding to the data having the n values.

11. The method according to claim 10, wherein data having a value providing a threshold nearer than the erase threshold to the thresholds corresponding to the data having the n values is set to the storage region before being programmed after the data having the n values is programmed to the storage regions.

12. The method according to claim 10, wherein the data of the plurality of storage regions is controlled to be a value providing a threshold of the memory cell transistor nearer than the erase threshold to the thresholds corresponding to the data having the n values after the setting of the erase data in the plurality of storage regions and prior to programming the data having the n values to the storage regions.

13. The method according to claim 10, wherein all of the thresholds of the transistors due to the data of the programmed storage regions and the threshold of the transistor due to the data of the at least one storage region before being programmed adjacent to the programmed storage regions are controlled to have one selected from a positive polarity and a negative polarity.

14. The method according to claim 10, wherein the data of the at least one storage region before being programmed adjacent to the programmed storage regions is controlled to have a value providing a threshold of the memory cell transistor contained in a distribution straddling 0 V.

15. The method according to claim 10, wherein the data of the at least one storage region before being programmed adjacent to the programmed storage regions is controlled to have a value providing the threshold nearest to the erase threshold of the thresholds of the memory cell transistors corresponding to the data having the n values.

16. The method according to claim 10, wherein the data of the at least one storage region before being programmed adjacent to the programmed storage regions is controlled to have a value providing a threshold of the memory cell transistor contained in a range narrower than a distribution of the erase threshold and wider than distributions of the thresholds corresponding to the data having the n values.

17. The method according to claim 10, wherein data is set in the plurality of storage regions to provide a threshold on a positive polarity side of the erase threshold after setting the memory cell transistors to the erase threshold by setting the erase data in the plurality of storage regions and prior to programming the data having the n values to the storage regions.

18. The method according to claim 17, wherein the data providing the threshold on the positive polarity side of the erase threshold is controlled to be one selected from the data having the n values.

19. The method according to claim 17, wherein a distribution of the threshold on the positive polarity side of the erase threshold is controlled to be narrower than a distribution of the erase threshold.

* * * * *